United States Patent [19]

Swanson

[11] Patent Number: 5,594,439

[45] Date of Patent: *Jan. 14, 1997

[54] DIAGNOSING PROBLEMS IN AN ELECTRICAL SYSTEM BY MONITORING CHANGES IN NONLINEAR CHARACTERISTICS

[75] Inventor: Eric J. Swanson, Buda, Tex.

[73] Assignee: Crystal Semiconductor Corporation, Austin, Tex.

[*] Notice: The term of this patent shall not extend beyond the expiration date of Pat. No. 5,594,612.

[21] Appl. No.: 295,451

[22] Filed: Aug. 24, 1994

[51] Int. Cl.$^6$ .................................................. H03M 1/06
[52] U.S. Cl. .......................... 341/118; 341/120; 341/140; 324/620; 324/626
[58] Field of Search .............................. 341/94, 118, 120, 341/121, 115, 140; 324/626, 601, 624, 620

[56] References Cited

U.S. PATENT DOCUMENTS

| | | | |
|---|---|---|---|
| 3,862,380 | 1/1975 | Hekimian et al. | 179/175.3 R |
| 4,222,107 | 9/1980 | Mrozowski et al. | 364/571 |
| 4,225,963 | 9/1980 | Ferrieu | 375/28 |
| 4,272,760 | 6/1981 | Prazak et al. | 340/347 |
| 4,340,882 | 7/1982 | Maio et al. | 340/347 |
| 4,381,495 | 4/1983 | Hotta et al. | 340/347 DA |
| 4,539,683 | 9/1985 | Hahn et al. | 371/15 |
| 4,612,533 | 9/1986 | Evans | 340/347 CC |
| 4,709,225 | 11/1987 | Welland et al. | 340/347 |
| 4,746,902 | 5/1988 | Tol et al. | 340/347 |
| 4,775,851 | 10/1988 | Borth | 341/155 |
| 4,835,535 | 5/1989 | Shibayama et al. | 341/120 |
| 4,852,035 | 7/1989 | Michener | 364/724.1 |
| 4,893,264 | 1/1990 | Noll et al. | 364/724.1 |
| 4,943,807 | 7/1990 | Early et al. | 341/120 |
| 4,972,360 | 11/1990 | Cukier et al. | 364/724.04 |
| 4,997,403 | 12/1990 | Larson | 341/143 |
| 4,999,627 | 3/1991 | Agazzi | 341/131 |
| 5,087,914 | 2/1992 | Sooch et al. | 341/120 |
| 5,134,402 | 7/1992 | Miyoshi | 341/144 |
| 5,153,593 | 10/1992 | Walden et al. | 341/143 |
| 5,248,970 | 9/1993 | Sooch et al. | 341/120 |
| 5,257,026 | 10/1993 | Thompson et al. | 341/118 |

OTHER PUBLICATIONS

Lu et al., "A High Quality Analog Oscillator Using Oversampling D/A Conversion Techniques," IEEE, New York, N.Y., IEEE Transactions on Circuits and Systems—II: Analog and Digital Signal Processing, vol. 41, No. 7, Jul. 1994.

(List continued on next page.)

*Primary Examiner*—Todd DeBoer
*Attorney, Agent, or Firm*—Arnold, White & Durkee

[57] ABSTRACT

Abnormal changes in the non-linear characteristics of electronic components are an indication of abnormal conditions such as impending component or system failure. To detect such abnormal changes in nonlinearity, an electronic circuit is subjected to a calibration signal including at least one frequency component. Nonlinearity in the electronic circuit causes distortion components to be generated from the calibration signal. Preferably the nonlinearity is characterized by compensation coefficients that digitally compensate the nonlinearity. The compensation coefficients are adjusted in a feedback loop in response to measured values of the distortion components, so that the distortion components are minimized. At the end of the adjustment process, the transfer function of the electronic circuit is specified by the compensation coefficients, which are stored in memory. The compensation coefficients are compared to respective limits to detect abnormal nonlinearity, and any abnormal nonlinearity is reported to a human operator or to a diagnostic computer. At various times, the measurement process is repeated, and the new values of the compensation coefficients are again compared to their respective limits as well as to their previous values stored in memory. Changes in the compensation coefficients with respect to their previous values are computed and compared to respective "drift" limits, so that abnormal conditions are also detected from abnormal changes in the nonlinearity over intervals of time.

26 Claims, 17 Drawing Sheets

OTHER PUBLICATIONS

Lu et al., "An Analog Multi–Tone Signal Generator for Built–In–Self–Test Applications," IEEE New York, N.Y., International Test Conference, Washington, D.C., Oct. 2–6, 1994, pp. 650–659.

Toner et al., "A BIST Scheme for an SNR Test of a Sigma–Delta ADC," IEEE, New York, N.Y., International Test Conference, Baltimore, Maryland, Oct. 17–21, 1993, pp. 805–814.

Toner et al., "Towards Built–In–Self–Test for SNR Testing of a Mixed–signal IC," IEEE, New York, N.Y., International Symposium on Circuits and Systems, Chicago, IL, May 3–6, 1993, pp. 1599–1602.

Toner et al., "Histogram–Based Distortion and Gain Tracking Testing of an 8–bit PCM Mixed Analog–Digital IC Chip," IEEE, New York, N.Y., Proceedings of the 32nd Midwest Symposium on Circuits and Systems, Washington, D.C., pp. 760–763, Aug. 1992.

Lu, et al., "High–Quality Analog Oscillator Using Oversampling D/A Conversion Techniques", Jul. 1, 1993.

Cataltepe et al., "Digitally Corrected Multi–Bit $\Sigma\Delta$ Data Converters", 1989 IEEE International Symposium on Circuits and Systems, Portland Hilton, Portland, OR, May 8–11, 1989, pp. 647–650.

Matsuya, et al., "A 17–bit Oversampling D–to–A Conversion Technology Using Multistate Noise Shaping", 1989 IEEE Journal of Solid–State Circuits, vol. 24, No. 4, Aug. 1989, pp,. 969–975.

"Self–Calibrating High Resolution True 16–Bit Digital–To–Analog Converter", Jun. 1981, Burr–Brown Research Corporation,Tucson, Arizona.

Prazak et al., "Correcting errors digitally in data acquisition control", Electronics, Nov. 22, 1979, pp. 123–128.

Maio, et al., "An Untrimmed D/A Converter with 14–Bit Resolution", IEEE Journal of Solid–State Circuits, vol. SC–16, No. 6, Dec. 1981, pp. 616–620.

Ferguson, et al., "An 18b 20KHz Dual $\Sigma\Delta$ A/D Converter", 1991 IEEE International Solid–State Circuits Conference, Feb. 14, 1991, pp. 68–69, 292.

Kerth et al., "A 120dB Linear Switched–Capacitor Delta–Sigma Modulator", 1994 IEEE International Solid State Circuits Conference, Feb. 17, 1994, pp. 196–197.

Lee et al., "Self–Calibration Technique for A/D Converters", IEEE Transactions on Circuits and Systems, vol. CAS–30, No. 3, Mar. 1983, pp. 188–190.

Lee, et al., "Self–Calibrating 15 Bit CMOS A/D Converter", IEEE Journal of Solid State Circuits, vol. SC–19, No. 6, Dec. 1984, pp. 813–819.

L. Richard Carley, "A Noise–Shaping Coder Technology for 15+ Bit Converters", IEEE Journal of Solid–State Circuits, vol. 24, No. 2, Apr. 1989, 267–273.

Yang, et al., "On–Line Adaptive Digital Correction of Dual–Quantisation Delta–Sigma Modulators", Electronics Letters 30 Jul. 1992 vol. 28, No. 16, pp. 1511–1513.

Abdennadher, et al., "Adaptive Selfcalibrating Delta–Sigma Modulators", Electronic Letters, 2nd Jul. 1992, vol. 28, No. 14, pp. 1288–1289.

van den Enden et al., "Discrete–time signal processing—An introduction", Prentice Hall International (UK) Ltd., New York, N.Y 1989, pp. 108–109, 272–273.

Fig. 11A
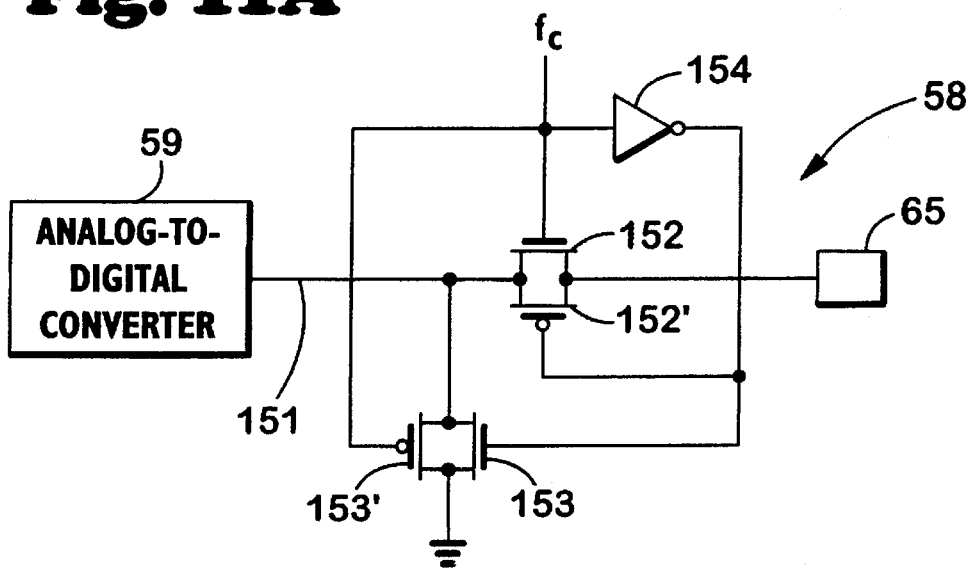
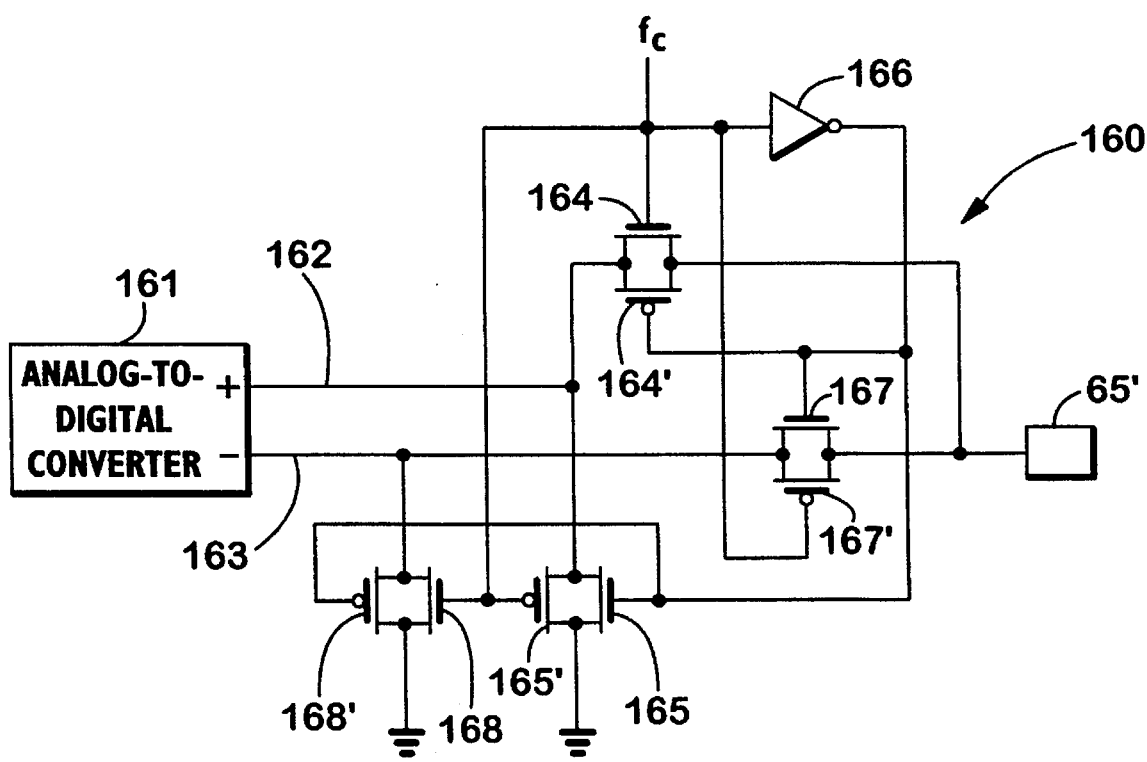
Fig. 11B

DIAGNOSING PROBLEMS IN AN ELECTRICAL SYSTEM BY MONITORING CHANGES IN NONLINEAR CHARACTERISTICS

BACKGROUND OF THE INVENTION

1. Filed of the Invention

The present invention relates generally to diagnosing problems in electrical circuits, and more particularly to a method of monitoring changes in electrical characteristics for diagnosing problems prior to component or system failure. The present invention specifically relates to diagnosing problems in an electrical system by monitoring changes in nonlinear characteristics.

2. Description of the Background Art

Linearity is a desirable characteristic for electrical components such as amplifiers, filters, transducers, digital-to-analog converters, and analog-to-digital converters. For instrumentation applications, the non-linearity represents an error or deviation from an accurate value. In audio or signal processing applications, the non-linearity generates harmonic and intermodulation distortion. Such harmonic and intermodulation distortion may mask desired components of a signal being processed. For example, delta-sigma digital-to-analog and analog-to-digital converters are capable of providing precision greatly in excess of sixteen bits. At the higher resolution, non-linearity becomes significant with respect to the least significant bit of resolution.

Although components can be designed, fabricated, and tested or calibrated to have a specified linearity, the linearity can degrade with time or due to abnormal operating conditions or stress placed on the components. For example, excessive power dissipation of an on-chip voltage regulator or power driver may cause a thermal protection circuit to limit current to the voltage regulator or power driver. This current limitation may cause severe distortion of a signal being processed by the electrical system.

Drift in the nonlinear characteristics of components in an electrical system can be corrected by periodic calibration of the system. However, such periodic calibration may tend to mask the symptoms of a more serious problem that may lead to a catastrophic system failure. Therefore, there is a need for diagnosing problems that cause changes in the nonlinear characteristics of components in an electrical system.

SUMMARY OF THE INVENTION

In accordance with an aspect of the invention, there is provided a method of sensing and indicating an abnormal condition in an electrical circuit. The method includes the steps of measuring nonlinearity of the electrical circuit to obtain a first measurement of the nonlinearity of the electrical circuit, and at a later time, again measuring the nonlinearity of the electrical circuit to obtain a second measurement of the nonlinearity of the electrical circuit; comparing the second measurement to the first measurement to detect an abnormal change in the nonlinearity; and indicating a presence of the abnormal condition when the comparing detects the abnormal change in the nonlinearity. This method has the advantage that abnormal changes in nonlinearity can be distinguished from changes that are expected due to drift of operating conditions and aging of components.

In a preferred embodiment, the electronic system further includes an analog signal generator for generating an analog signal; a signal processing circuit having a signal input connected to the analog signal generator for receiving the analog signal and a signal output; an analog multiplexer connected to the analog signal generator and to the signal output of the signal processing circuit for selecting the analog signal either before or after processing by the signal processing circuit; an analog-to-digital converter connected to the analog multiplexer for digitizing the signal selected by the analog multiplexer and asserting the digitized signal on a digital output; digital circuitry connected to the digital output of the analog-to-digital converter for analyzing the digitized signal to produce measurements of nonlinearity of a transfer characteristic from the analog signal generator to the digital output; and a programmed controller connected to digital circuitry for receiving the measurements of the nonlinearity of the transfer characteristic from the digital circuitry and connected to the multiplexer for operating the multiplexer so that one of the measurements indicates nonlinearity of the analog-to-digital converter and another of the measurements indicates nonlinearity of a combination of the signal processing circuit and the analog-to-digital converter. The programmed controller is programmed to compute an indication of nonlinearity of the signal processing circuit from the one of the measurements and the another of the measurements. Moreover, to determine whether a particular part of the signal processing circuit has a linearity problem, the analog multiplexer is provided with a number of inputs connected to respective signal outputs of cascaded signal conditioning circuits that make up the signal processing circuit. In this case, the programmed controller is programmed to operate the multiplexer to select a respective analog signal from each signal output and to receive from the digital circuitry a measurement representing nonlinearity of a respective transfer function from each signal output, and for computing from the measurements a respective indication of nonlinearity of each of the signal conditioning circuits. By measuring nonlinearity of the transfer characteristic from successive signal outputs of the cascaded signal conditioning circuits, a particular signal conditioning circuit can be identified and diagnosed as having a linearity problem.

BRIEF DESCRIPTION OF THE DRAWINGS

Other objects and advantages of the invention will become apparent upon reading the following detailed description and upon reference to the drawings in which:

FIG. 11A is a schematic diagram of a switching modulator introduced in FIG. 2, and constructed for use with a single-ended input to an analog-to-digital converter;

FIG. 11B is a schematic diagram of an alternative circuit for a switching modulator for use with an analog-to-digital converter having complementary inputs;

Figure 1:
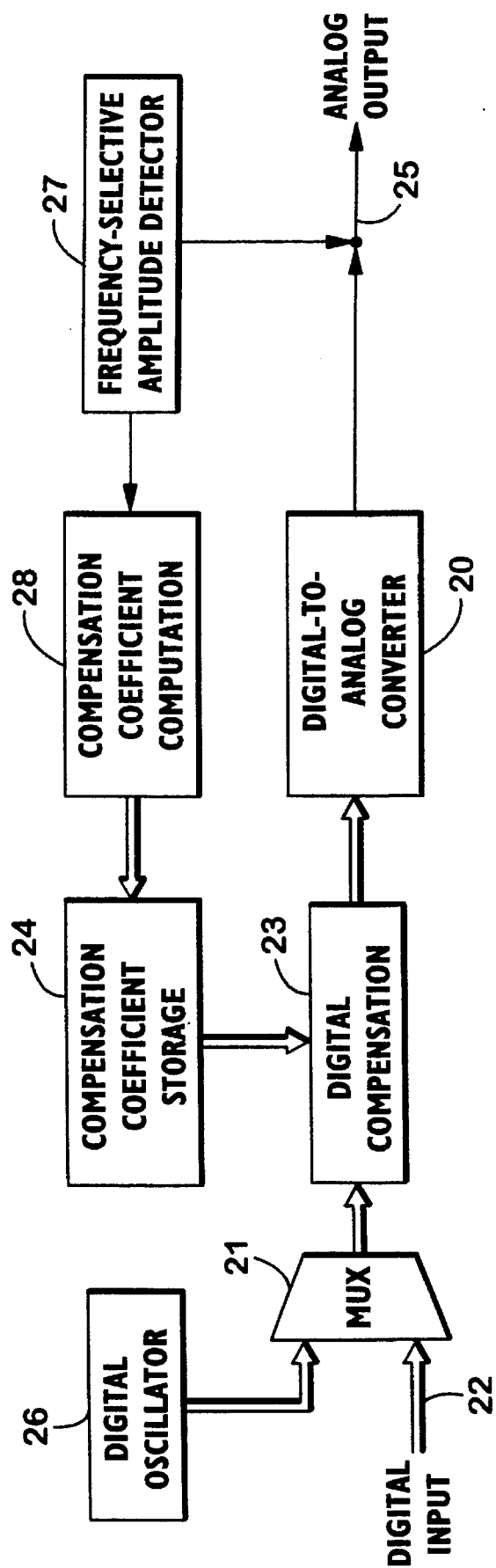
FIG. 1 is a block diagram of a digital-to-analog converter using a digital compensation technique in accordance with the invention for correcting nonlinearity.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the scope of the invention as defined by the appended claims.

DESCRIPTION OF THE PREFERRED EMBODIMENTS

Turning now to the drawings, there is shown in FIG. 1 a block diagram of a digital-to-analog converter 20 and associated components for digitally compensating nonlinearity in the converter. During a normal mode of operation, a digital multiplexer 21 selects a digital input 22 and applies the digital input to digital compensation 23. The digital compensation 23 modifies the digital input 22 in accordance with compensation coefficients read from storage 24. The compensated digital input is converted by the digital-to-analog converter 20 to provide an analog output 25.

The digital compensation 23 could be performed in a variety of ways, such as by addressing the storage 24 with the digital value to look-up a corresponding compensated value. Alternatively, the digital compensation could be performed by interpolation between values looked up in a table addressed by a most significant bit portion of the digital input. As further described below with reference to FIGS. 2 and 4, however, the preferred method of digital compensation is computation of a polynomial function of the digital input using polynomial coefficients read from the compensation coefficient storage 24.

The present invention more particularly concerns a method for determining the values of the compensation coefficients in order to correct for nonlinearity in the digital-to-analog converter 20. These compensation coefficients are determined by operating the digital-to-analog converter 20 in a calibration mode. During the calibration mode, the multiplexer 21 selects the digital oscillator 26, and applies the digital values from the oscillator to the digital compensation 23. The multiplexer 21, for example, could be an adder or addition step in which the digital input 22 is forced to zero during calibration. Consequently, the digital-to-analog converter 20 responds to the digital oscillator 26 to generate an analog output 25 including at least one frequency component.

Nonlinearity in the digital-to-analog converter 20 causes frequency components other than those generated by the digital oscillator 26 to appear in the analog output 25. The nonlinearity is removed by adjusting the compensation coefficients so that only the frequency components generated by the digital oscillator 26 appear in the analog output 25. For this purpose, a frequency-selective amplitude detector 27 is tuned to a harmonic component of at least one frequency component from the digital oscillator 26, or is tuned to an intermodulation component of more than one frequency component from the digital oscillator 26. Based on the distortion component detected by the detector 27, compensation coefficient computation 28 computes a value for at least one of the compensation coefficients in the storage 24 in such a way as to reduce or eliminate the distortion component detected by the detector 27. This process can be repeated until the distortion component is reduced below a predetermined level or for a fixed number of iterations. This process can be repeated for additional distortion components obtained by changing the frequency or frequencies generated by the digital oscillator 26 or selected by the detector 27.

The nonlinearity compensation method of FIG. 1 has the advantage that it does not require a linearity reference, because the digital oscillator 26 inherently generates very pure frequency components, and the frequency-selective amplitude detector 27 is easily constructed so that it does not introduce significant nonlinearity in the feedback loop. Therefore, the digital compensation method illustrated in FIG. 1 can be used to correct for integral nonlinearity in any kind of digital-to-analog converter without requiring a linearity reference.

The nonlinearity compensation method of FIG. 1 has the additional advantage that the compensation coefficients are determined in a feedback loop (including blocks 20, 23, 24, 27 and 28) that is relatively insensitive to the magnitude of the loop gain. Moreover, the frequency-selective amplitude detector 27 may indicate the average value, the RMS value, energy, or any other characteristic or measure indicative of or responsive to the amplitude of the signal passing within the pass-band of the frequency-selective amplitude detector 27. The feedback loop assures that the distortion component is reduced to zero when any of these characteristics or measures is reduced to zero.

The nonlinearity compensation method of FIG. 1 also has the advantage that it is not necessary to measure the DC level of the analog output 25, so that the method is relatively immune from 1/f noise. Instead, the nonlinearity compensation method of FIG. 1 is responsive to the amplitudes of distortion components at sufficiently high frequencies that the nonlinearity correction is not limited by 1/f noise.

It is also possible to use the system shown in FIG. 1 for obtaining a specified nonlinear digital-to-analog transfer function from the digital input 22 to the analog output 25. In this case, the nonlinearity of the digital-to-analog converter 20 is first compensated as described above. Then the compensation coefficients in the storage 24 are adjusted by a certain amount to obtain the specified nonlinear digital-to-analog transfer function. For example, if the compensation coefficients specify a polynomial, as further described below with reference to FIG. 2, then the coefficients are adjusted by adding polynomial terms representing the desired nonlinearity. A specified nonlinear digital-to-analog transfer function, for example, can be used for decompression of previously compressed signals or for the compression of digital signals to obtain compressed analog signals.

Figure 2:
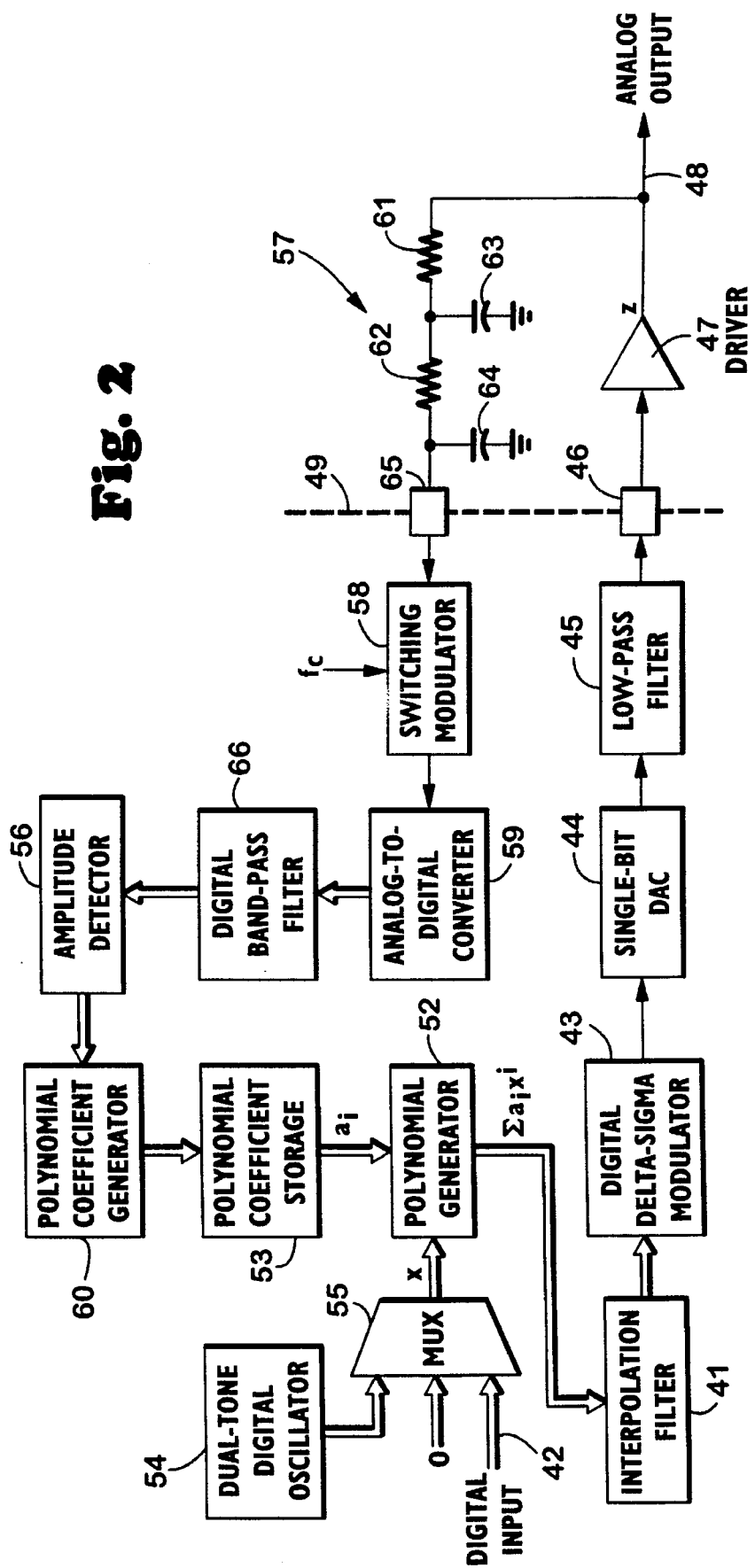
FIG. 2 is a specific embodiment of a digital-to-analog converter using the digital compensation technique introduced in FIG. 1.

Turning now to FIG. 2, there is shown a block diagram of a preferred embodiment of a digital-to-analog converter including circuitry for compensating nonlinearity. In this example, the digital-to-analog converter is a delta-sigma digital-to-analog converter. Such a delta-sigma digital-to-analog converter may include an interpolation filter 41 for receiving a digital input 42 at a certain sampling rate and increasing the sampling rate by a predetermined factor such as a factor of 128. The output of the interpolation filter 41 is provided to a digital delta-sigma modulator 43 which converts the digital signal to a 1-bit digital stream. The 1-bit digital stream is provided to a single-bit digital-to-analog converter (DAC) 44 which converts the digital stream to an analog signal having either one of two voltage levels. This analog signal is filtered by a low-pass filter 45 to produce an analog signal having a more smoothly varying amplitude so that the digital input 42 is represented by an analog signal having frequency components limited to no more than about one-half the original sampling rate of the digital input 42. Further details regarding the construction and operation of a delta-sigma digital-to-analog converter are disclosed in Sooch et al., U.S. Pat. No. 5,087,914, incorporated herein by reference.

The output of the low-pass filter 45 appears on a terminal 46 and may be buffered by a driver 47 to provide a low-impedance analog output 48. In practice, it is desirable to fabricate the interpolation filter 41, the digital delta-sigma modulator 43, the single-bit digital-to-analog converter 44, and the low-pass filter 45 in a common semiconductor integrated circuit along with other components shown in FIG. 2 to the left of an integrated-circuit boundary 49 shown as a dashed line. The driver 47, however, is external to the integrated circuit, so as to supply any desired level of power or other signal conditioning, to the analog output 48. This also permits the semiconductor integrated circuit to be used in a variety of different applications in which the customer of the integrated circuit furnishes an external signal conditioning circuit such as the driver 47 for a specific application. If a high level of power is not needed, then the driver 47 could be omitted so that the terminal 46 would provide the analog output 48.

In order to compensate for nonlinearity in the combination of the single-bit DAC 44, the low-pass filter 45, and the driver 47, the digital input signal from the digital input 42 is pre-distorted by a polynomial generator 52 which generates a polynomial $\Sigma a_i x^i$ of the interpolated digital signal (x) and a set of polynomial coefficients ($a_i$) from the polynomial coefficient storage 53.

In order to determine a set of polynomial coefficients so that the analog output 48 is a linear function of the digital input 42, the circuit in FIG. 2 includes a dual-tone digital oscillator 54, and a digital multiplexer 55 that either selects the digital input 42 during a normal mode of operation, or selects the output of the dual-tone digital oscillator 54 during a calibration mode, or selects a value of zero during the calibration mode, and provides the selected signal (x) to the polynomial generator 52. (Of course, a value of zero could be selected in any number of alternative and equivalent ways, such as always operating the multiplexer in the calibration mode to select the output of the dual-tone oscillator 54, and forcing the output of the oscillator to zero by loading zeros into the oscillator.)

For the construction shown in FIG. 2, the digital input 42 and the dual-tone digital oscillator 54 would supply digital samples at the same rate to their respective inputs of the multiplexer 55. This would permit the dual-tone digital oscillator 54 to operate at a relatively low rate. The dual-tone oscillator 54 could be operated at a higher sampling rate than the sampling rate of the digital input 42, however, if an additional interpolation filter (not shown) were inserted between the digital input 42 and the multiplexer 55. Operation of the dual-tone digital oscillator 54 at the higher rate would reduce noise in the oscillator signal. For example, the additional interpolating filter (not shown) could increase the sampling rate of the digital input 42 from 2000 samples per second to 16,000 samples per second, and in this example the dual-tone digital oscillator 54 would be operated at a sampling rate of 16,000 samples per second, and the interpolation filter 41 could increase the rate of 16,000 samples per second to a rate of 128,000 samples per second.

For determining a constant polynomial coefficient ($a_0$), the multiplexer 55 selects a value of zero, and supplies the value of zero to the polynomial generator 52. As further described below, the constant coefficient ($a_0$) is generated such that the analog output 48 has a value of substantially zero when the polynomial generator 52 has an input value (x) of zero. In this fashion, dc offset is removed from the digital-to-analog conversion process (from the input value (x) to the analog output 48) before the determination of the quadratic ($a_2$), the cubic ($a_3$), and any higher-order polynomial coefficients.

For determining the quadratic ($a_2$), the cubic ($a_3$), and any higher-order polynomial coefficients, the dual-tone digital oscillator generates a calibration signal including a pair of frequencies. This calibration signal is selected by the multiplexer 55 and passes through the polynomial generator 52, the interpolation filter 41, the digital delta-sigma modulator 43, the single-bit DAC 44, the low-pass filter 45, and the driver 47. Let z(x) denote the transfer function of this signal path from the input (x) of the polynomial generator 52 to the analog output 48. Nonlinearity in this transfer function z(x)

generates harmonics and intermodulation components between the two frequencies of the calibration signal from the oscillator 54, and these harmonics and intermodulation components appear at the analog output 48.

The transfer function $Z(x)$ can be expressed as a power series of the input (x) according to:

$$Z(x) = \alpha_0 + \alpha_1 x + \alpha_2 x^2 \alpha_3 x^3 +.$$

The second order term $\alpha_2 x^2$ can generate second harmonics and intermodulation products between two sinusoids $\cos(\omega_1 t)$ and $\cos(\omega_2 t)$ according to:

$$\begin{aligned}\alpha_2(\cos(\omega_1 t) + \cos(\omega_2 t))^2 &= \alpha_2 \cos^2(\omega_1 t) + \alpha_2 \cos^2(\omega_2 t) + \\ &\quad 2\alpha_2 \cos(\omega_1 t)\cos(\omega_2 t) \\ &= \alpha_2 + 1/2\alpha_2 \cos(2\omega_1 t) + 1/2\alpha_2 \cos(2\omega_2 t) + \\ &\quad \alpha_2 \cos((\omega_1 - \omega_2)t) + \alpha_2 \cos((\omega_1 + \omega_2)t)\end{aligned}$$

Therefore, the second-order term generates four new frequencies, including two harmonics at $2\omega_1$ and $2\omega_2$, and two intermodulation components at $\omega_1 31 \omega_2$, and $\omega_1 + \omega_2$. In a similar fashion, it can be shown that the third-order term generates six additional frequencies, including two harmonics at $3\omega_1$ and $3\omega_2$, and four intermodulation components at $2\omega_1 - \omega_2$, $\omega_1 - 2\omega_2$, $2\omega_1 + \omega_2$, and $\omega_1 + 2\omega_2$. In this fashion, a new frequency at an integer multiple of an original frequency is referred to as a harmonic, and the other new frequencies are referred to as intermodulation components. Harmonics and intermodulation components will be referred to collectively as distortion components.

For the circuit of FIG. 2, it is assumed that the gain factor $\alpha_1$ is one, and in this case, if $\alpha_2$ and $\alpha_3$ are small in comparison to 1, then the values of $a_2 = -\alpha_2$ and $a_3 = -\alpha_3$ will effectively cancel the nonlinearity. Preferably, however, an amplitude detector 56 and a digital band-pass filter 66 are used in a feedback loop to find the values of $a_2$ and $a_3$ that best cancel the nonlinearity. The feedback loop also includes a continuous-time low-pass filter generally designated 57, a switching modulator 58, an analog-to-digital converter 59, and a polynomial coefficient generator 60.

Preferably the amplitude detector 56 and band-pass filter 66 detect an intermodulation component at a frequency lower than the two original frequencies generated by the dual-tone digital oscillator 54. Preferably the band-pass filter 66 has a fixed passband, and the intermodulation component to be detected has a frequency ($f_d$) which is relatively fixed throughout the process of generating the polynomial coefficients $a_2$ and $a_3$ that effectively cancel the nonlinearity coefficients $\alpha_2$ and $\alpha_3$. The fixed frequency fd is within the passband of the digital band-pass filter 66. When generating the polynomial coefficient $a_2$, the intermodulation detector detects the difference $(f_d = f_1 - f_2)$ of the two frequencies $(f_1)$ and $(f_2)$ generated by the dual-tone oscillator 54. When generating the polynomial coefficient $a_3$, at least one (and preferably only one) of the two frequencies of the dual-tone digital oscillator is changed so that at this later time the difference between one of the two frequencies of the dual-tone digital oscillator 54 and twice the other of the two frequencies of the dual-tone digital oscillator is approximately the frequency $f_d$. For example, when generating the polynomial coefficient $a_3$, the dual-tone digital oscillator generates frequencies $f_1$ and $f_3$ such that $f_d = f_1 - 2 f_3$ and therefore $f_2 = 2 f_3$.

Preferably the low-pass filter 57 sufficiently attenuates the two tones from the dual-tone digital oscillator 54, and the distortion components other than the component to be detected, so that any nonlinearity in the feedback path (from the analog output 48 to the amplitude detector 56 and including the low-pass filter 57, switching modulator 58, analog-to-digital converter 59, and digital band-pass filter 66) will only generate distortion components which are negligible compared to the distortion components generated in the forward path (from the input of the polynomial generator 52 to the analog output 48 and including the interpolation filter 41, the polynomial generator 52, the digital delta-sigma modulator 43, the single-bit DAC 44, the low-pass filter 45, and the driver 47).

As shown in FIG. 2, the continuous-time low-pass filter 57 includes series resistors 61, 62 and shunt capacitors 63, 64. Although the low-pass filter 57 is shown having two resistor-capacitor sections, the filter 57 could have a greater or lesser number of sections. The number of sections needed depends on the frequency difference between the intermodulation component to be detected and the lower oscillator frequency generating the intermodulation component, the desired amount of rejection of power line noise, the dynamic range of the analog-to-digital converter 59, and the linearity of the analog-to-digital converter 59. The resistor 61 has a low voltage coefficient; for example, it is a highly linear metal film resistor. The capacitor 63 also has a relatively low voltage coefficient; for example, it is fabricated of polypropylene film, polystyrene film, polyester film, or mica. The linearity of the capacitor 63, however, is not particularly critical because the tones at the analog output 48 from the dual-tone digital oscillator are partially low-pass filtered upon reaching the capacitor 63. Neither the linearity of the resistor 62 nor the linearity of the capacitor 64 is critical because the filtering of the resistor 61 and the capacitor 63 attenuates the undesired signals before the undesired signals reach the resistor 62 and the capacitor 64.

The cut-off frequency of the low-pass filter 57 is preferably at about the frequency $f_d$ of the intermodulation component detected by the amplitude detector 56 and the band-pass filter 66. For example, the frequency $f_d$ is 4 Hz, and the cut-off frequency of the low-pass filter 57 is slightly above 4 Hz, for example at about 6 Hz.

The switching modulator 58 can be used in order to determine the zero-order polynomial coefficient ($a_0$) in such a way that the analog output 48 is at a ground reference when the digital input 42 is zero, as will be further described below. So that this dc offset calibration can be performed independent of any dc offset of the analog-to-digital converter 59, the switching modulator 58 is an analog modulator, as described below with reference to FIGS. 10A and 10B, which provides a modulated signal to the input of the analog-to-digital converter 59.

In an alternative construction that may be used if the analog-to-digital converter 59 has a relatively low dc offset, the switching modulator circuitry can be simplified by interchanging the positions of the switching modulator 58 and the analog-to-digital converter 59 so that the input of the analog-to-digital converter is connected directly to the terminal 65 and the switching modulator modulates the output of the analog-to-digital converter and supplies the modulated signal to the input of the digital band-pass filter 66. In this alternative construction, the switching modulator is simplified because the modulation can be performed digitally by selectively complementing the digital output of the analog-to-digital converter 59 in response to the modulating or chopping signal ($f_c$). For example, the output of the analog-to-digital converter 59 could be received by an adder/subtractor that is controlled by the chopping signal ($f_c$) to either add or subtract the digital output of the analog-to-digital converter 59. This adder/subtractor would be used in-lieu of the adder 96 at the input of the digital band-pass filter shown in FIG. 5 and further described below.

In a second alternative construction that may be used if the analog-to-digital converter 59 has a relatively low dc offset, the switching modulator 58 would be eliminated and a digital modulator would not be used. Instead, the coefficients in the band-pass filter 66 would be changed just during the determination of the zero-order coefficient ($a_o$) so that the band-pass filter would become a low-pass filter at this time, and also at this time the amplitude detector 56 would have its polarity selected or forced so as to cancel or reduce the dc offset at the analog output 48. This second alternative construction would operate in a fashion analogous to the cancellation of dc offset at the digital output 217 in the system of FIG. 12A, as will be further described below.

Preferably the analog-to-digital converter 59 is a delta-sigma converter including a delta sigma modulator generating a one-bit data stream, and a digital decimating or band-pass filter responsive to the one-bit data stream rate for producing a multi-bit digital output. Further details regarding the construction of suitable delta-sigma analog-to-digital converters are found in Early et al., U.S. Pat. No. 4,943,807, incorporated herein by reference; and Ferguson et al., "An 18$b$ 20 KHz Dual $\Sigma \Delta$ AD Converter," Proceedings of the 1991 IEEE International Solid-State Circuits Conference, pp. 68–69 and 292, incorporated herein by reference; and Kerth, et al., "A 120 dB Linear Switched-capacitor $\Delta$–$\Sigma$ Modulator," Proceedings of the 1994 IEEE International Solid-State Circuits Conference, pp. 196–197, incorporated herein by reference.

The analog-to-digital converter 59 may have a relatively low speed and relatively low dynamic range, because the frequency and amplitude of the intermodulation component to be detected, the dc component, and residual high frequency components are relatively low. This results from the fact that the magnitudes of the nonlinearity coefficients $\alpha_2$ and $\alpha_3$ are relatively small, and the tones from the dual-tone oscillator and other high frequencies are rejected by the low-pass filter 57. The linearity of the analog-to-digital converter 59 is not critical, because the fundamental frequency components are small at this point. Any distortion of the intermodulation component to be detected is not significant because the intermodulation component becomes nearly zero when each polynomial coefficient is generated by adjusting the coefficient to minimize the intermodulation component.

In operation, the circuit of FIG. 2 is initially set to a calibration mode in which the multiplexer 55 first outputs a zero value to the polynomial generator. For generating the zero-order coefficient $a_0$ so that the analog output 48 is zero when the digital input 42 is zero, the switching modulator 58 is enabled by a signal $f_c$ to chop any DC component of the analog output 48. The switching modulator, for example, chops at 4 Hz rate equal to the center frequency of the digital band-pass filter 66. Any 4 Hz component generated by chopping any DC component is passed by the digital band-pass filter 66 and is detected by the amplitude detector 56. The polynomial coefficient generator 60 adjusts the coefficient $a_0$ so that any 4 Hz component is eliminated. During the adjustment process, and from this point on, the polynomial generator 52 adds the coefficient $a_0$ to the input (x), to form the polynomial that is converted by the digital delta-sigma modulator 43. This completes the offset cancellation. The switching modulator 58 is turned off so as to pass signals without modification; for example, the chopping signal ($f_c$) is changed from a 4 Hz binary signal to a constant logic level to disable the switching modulator.

For generating the second-order coefficient $a_2$, the digital oscillator 54 is set to frequencies, for example, of 500 Hz and 496 Hz, each having an amplitude of a little below one-half of full scale. These two frequencies are each about half of the cut-off frequency of the low-pass filter 45, which is, for example, about 1000 kHz. The multiplexer 55 selects the output of the dual-tone digital oscillator and passes the output to the input (x) of the polynomial generator 52. For an initial value of $a_2$ equal to zero, any second-order non-linearity in the forward path (the combination of the interpolation filter 41, the digital delta-sigma modulator 43, the single-bit DAC 44, the low-pass filter 45, and the driver 47) causes a 4 Hz intermodulation component to appear on the terminal 65. The analog-to-digital converter 59 receives the signal on the terminal 65 and converts it to a series of digital values provided to the digital band-pass filter 66 and the amplitude detector 56. The amplitude detector detects any 4 Hz intermodulation component passing through the digital band-pass filter 66, and the polynomial coefficient generator 60 adjusts the second-order polynomial coefficient $a_2$ so as to eliminate any detected 4 Hz component. During this time, and from this point on, the polynomial generator 52 multiplies the coefficient $a_2$ by the square of the input signal (x) and adds the product to the input (x), to form the polynomial that is converted by the digital delta-sigma modulator 43. This process, is repeated to adjust the second-order polynomial coefficient $a_2$ to the best possible value in sign and magnitude for a set number of iterations or until the amplitude of the detected 4 Hz signal drops below a predetermined level.

For generating the third-order coefficient $a_3$, the digital oscillator 54 is set to frequencies of 500 Hz and 248 Hz, each having an amplitude of a little below one-half of full scale. For an initial value of $a_3$ equal to zero, any third-order non-linearity in the forward path (the combination of the interpolation filter 41, the digital delta-sigma modulator 43, the single-bit DAC 44, the low-pass filter 45, and the driver 47) causes a 4 Hz intermodulation component to appear on the terminal 65. The analog-to-digital converter 59 receives the signal on the terminal 65 and converts it to a series of digital values provided to the digital band-pass filter 66. The amplitude detector detects any 4 Hz intermodulation component passing through the digital band-pass filter 66, and the polynomial coefficient generator 60 adjusts the third-order polynomial coefficient $a_3$ so as to eliminate any detected 4 Hz component. During this time, and from this point on, the polynomial generator 52 multiplies the coefficient $a_3$ by the cube of the input signal (x) and adds the product to the input (x), to form the polynomial that is converted by the digital delta-sigma modulator 43. This process is repeated to adjust the third-order polynomial coefficient $a_3$ to the best possible value in sign and magnitude for a set number of iterations or until the amplitude of the detected 4 Hz signal drops below a predetermined level.

This procedure could be continued to correct for fourth and higher-order nonlinearity by appropriate selection of frequencies of the digital oscillator 54, but correction of such higher-order nonlinearity would typically not be necessary in the system of FIG. 2, because the higher-order distortion components, as well as the lower-order components, would be below the noise floor after the above calibration procedure.

Finally, the multiplexer 55 is switched to select the output of the interpolation filter 41. This completes the DAC calibration procedure.

Figure 3:
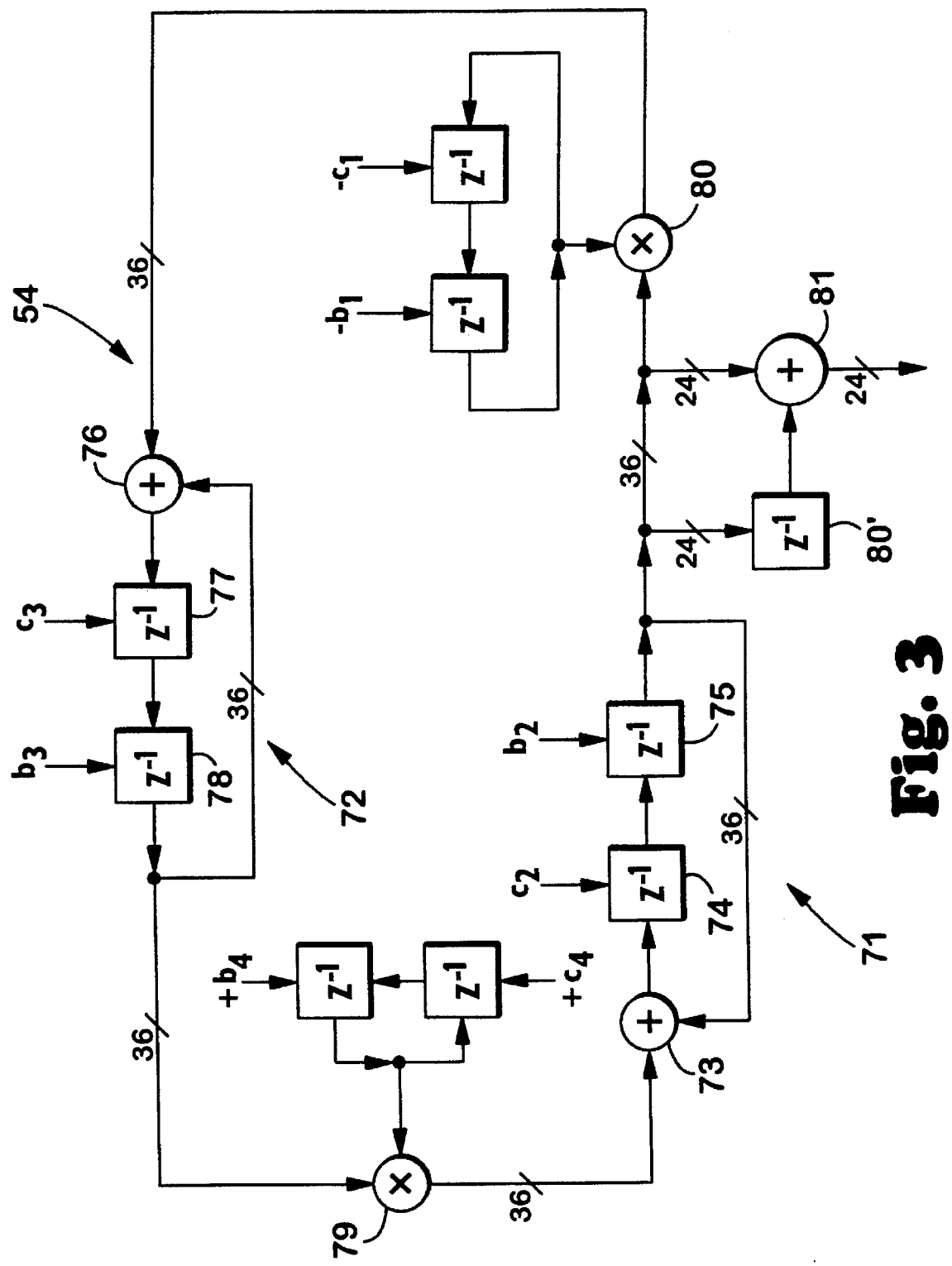
FIG. 3 is a schematic diagram showing details of the dual-tone digital oscillator introduced in FIG. 2.

Turning now to FIG. 3, there is shown a schematic diagram of the dual-tone digital oscillator 54. This schematic diagram is shown in digital filter representation. As is well known in the art, this representation is a specification for digital circuits which could be implemented in either dedicated hardware arranged as shown in FIG. 3, or in a digital signal processor programmed to perform the operations shown in FIG. 3 by executing a series of add, subtract, multiply, shift, load, store, input, output, or other instructions upon digital values in specified registers or addressable memory locations.

The oscillator 54 is based on a standard "coupled form" of a recursive second-order digital filter section. See, for example, FIG. 4.46 on page 109 and FIG. 10.10 on page 273 of Van Den Enden, *Discrete-Time Signal Processing*, Prentice Hall International (UK) Ltd., Hartfordshire, United Kingdom, 1989, incorporated herein by reference. In order to generate two tones, however, the delay units in the feedback loop of the oscillator 54 are duplicated so that computations for each of the two tones are computed during alternate sample times. The computations are performed to 36 bits of precision in order to obtain fine resolution in frequency selection. The "/36" in FIG. 3 indicates that the buses in the feedback loop carry 36 bits. The feedback loop includes a first accumulator generally designated 71 and a second accumulator generally designated 72. The first accumulator includes an adder 73, a first register 74, and a second register 75. In a similar fashion, the second accumulator 72 includes an adder 76, a first register 77, and a second register 78. The two accumulators are cross-coupled by a first multiplier 79 and a second multiplier 80. On alternate sample times, the first and second multipliers 79 and 80 multiply by a factor of $+b_4$ and $-b_1$, respectively, or $+c_4$ and $-c_1$, respectively. The values of the constant $b_1$ and $b_4$ determine the frequency of oscillation of the first tone, and the values of the constants $c_1$ and $c_4$ determines the frequency of the second tone. In particular, the frequency $\omega_o$, amplitude, and initial phase $\theta$ of the first tone is given by:

$$\omega_o = \begin{cases} \frac{1}{T} \cos^{-1}\left(1 - \frac{b_1 b_4}{2}\right) & \text{for } 0 < b_1 b_4 \leq 2 \\ \frac{1}{T} \pi - \frac{1}{T} \cos^{-1}\left(1 - \frac{b_1 b_4}{2}\right) & \text{for } 2 < b_1 b_4 < 4 \end{cases}$$

$$\theta = \tan^{-1}\left(\frac{b_2 \sin(\omega_o T)}{(1 - b_1 b_4 - \cos(\omega_o T))b_2 + b_4 b_3}\right)$$

$$\text{Amplitude} = \frac{(1 - b_1 b_4)b_2 + b_3 b_4}{\sin(\omega_o T + \theta)}$$

where T is the rate of computation of the alternate samples, which is one-half of the sampling rate of the registers in FIG. 3. If the constants "c" are substituted for the respective constants "b" in the above equations, the modified equations give the frequency $\omega_o$, amplitude, and initial phase $\theta$ of the second tone. A derivation of the above equations is found in A. K. Lu et al., "A High-Quality Analog Oscillator Using Oversampling D/A Conversion Techniques," McGill University, Montreal, Canada, Jul. 19, 1993, to appear in IEEE Trans. on Circuits and Systems—II: Analog and Digital Signal Processing, Vol. 41, No. 7, July 1994.

The output of the oscillator 54 is provided by an adder 81 and a register 82 which add together the alternate frequency samples generated by the oscillator. The sum is truncated to 24 bits, indicated by the "/24" symbol in FIG. 3.

Preferably the two frequencies of the oscillator are selected so that at least one of the multipliers 79 and 80 can be implemented by just a shift instruction. In this case, the multiplier multiplies by a power of two. Preferably, the constants $b_1$ and $b_4$ are close to each other, such that the larger one is less than twice the other, and similarly the constants $c_1$ and $c_4$ are close to each other, such that the larger one is less than twice the other.

Figure 4:
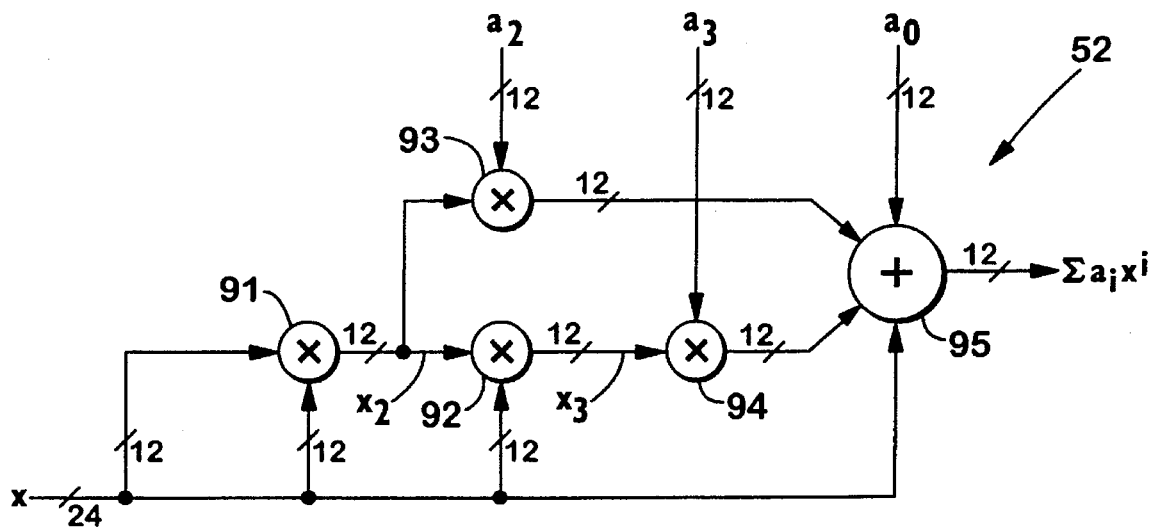
FIG. 4 is a schematic diagram showing the polynomial generator introduced in FIG. 2.

Turning now to FIG. 4, there is shown a schematic diagram of the polynomial generator 52. The input signal (x) is squared in a first multiplier 91, and cubed in a second multiplier 92. A third multiplier 93 computes the quadratic term $a_2 x^2$, and a fourth multiplier 94 computes a cubic term $a_3 x^3$. An adder 95 sums the quadratic term, the cubic term, a zero-order term $a_0$, and the input signal (x) to compute the polynomial $\Sigma a_i x^i$. In this example, the linear coefficient $a_1$ is equal to one, and no terms of higher order than the cubic term are included in the polynomial for the generator shown in FIG. 4. The polynomial generator of FIG. 4 could be modified to include additional terms by adding two additional multipliers for each additional term; one of the additional multipliers would compute the next higher power of (x), and the other additional multiplier would multiply the next higher power of (x) by the next higher-order coefficient and provide the product to the adder 96. The word lengths shown in FIG. 4 are sufficiently long to compensate for the amount of distortion expected in the components in the forward path following the polynomial generator (i.e., the digital delta-sigma modulator 43, the single-bit DAC 44, the low-pass filter 45, and the driver 47) in FIG. 2.

Figure 5:
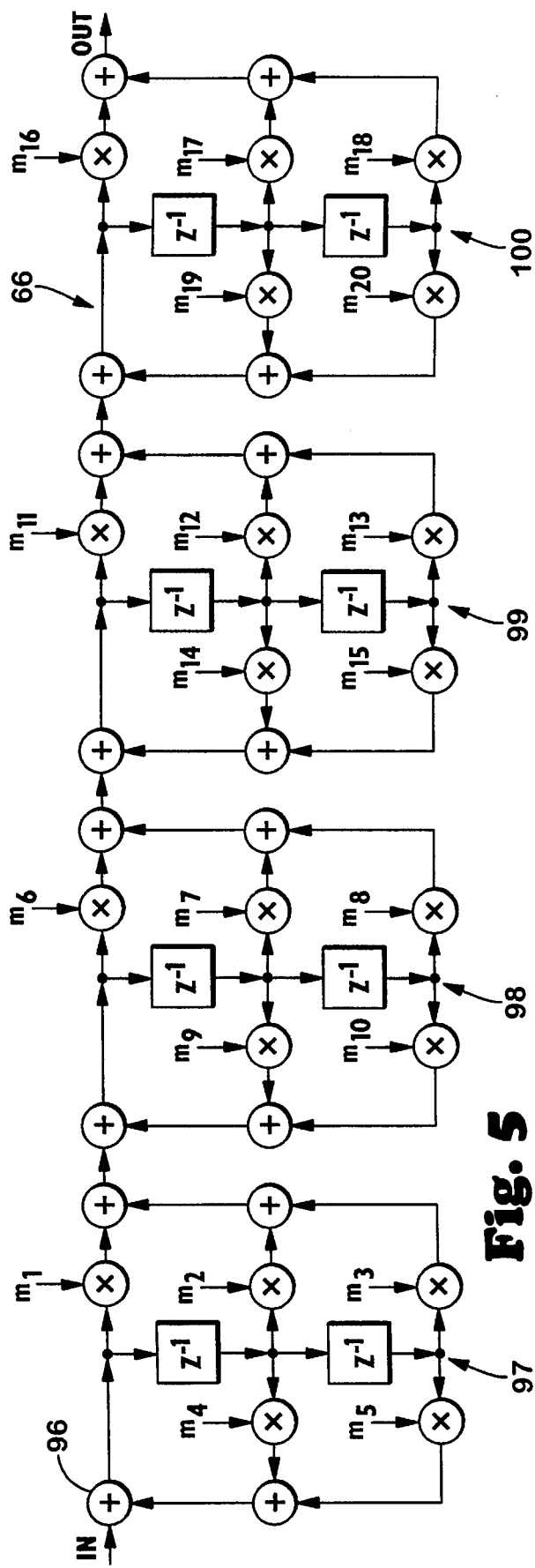
FIG. 5 is a schematic diagram of a digital band-pass filter introduced in FIG. 2.

Turning now to FIG. 5, there is shown a block diagram of the band-pass digital band-pass filter 66. As show, the digital band-pass filter is an eighth-order infinite-impulse response (IIR) filter having four cascaded second-order filter sections 97, 98, 99, 100. Each of the filter sections has feed-forward and feed-back paths from two accumulator registers. Preferably the digital filter constants $m_1$ to $m_{20}$ are selected for a Butterworth response with a 3.5 to 9.5 Hz bandwidth at a sample rate of 16,000 Hz. In this case, the digital filter constants have the following numerical values:

$m_1$=9.983825570628316E–01
$m_2$=–1.996765114125663E+00
$m_3$=9.983825570628316E–01
$m_4$=1.999769161853665E+00
$m_5$=–9.997707013646913E–01
$m_6$=2.227017359215435E–14
$m_7$=–4.454034718430869E–14
$m_8$=2.227017359215435E–14
$m_9$=1.999353885220964E+00
$m_{10}$=–9.993558843322849E–01
$m_{11}$=–1.000000000000000E+00
$m_{12}$=2.000000000000000E+00
$m_{13}$=1.000000000000000E+00
$m_{14}$=1.999214696632831E+00
$m_{15}$=–9.992176455454043E–01
$m_{16}$=1.000000000000000E+00
$m_{17}$=2.000000000000000E+00
$m_{18}$=1.000000000000000E+00
$m_{19}$=1.999634483601468E+00
$m_{20}$=–9.996383143702203E–01

The values listed above are given to greater precision than typically would be needed in the specific example of FIGS. 2 to 7. The precision of the registers and computations in the band-pass filter of FIG. 5, for example, is 24 or 32 bits.

Figure 6:
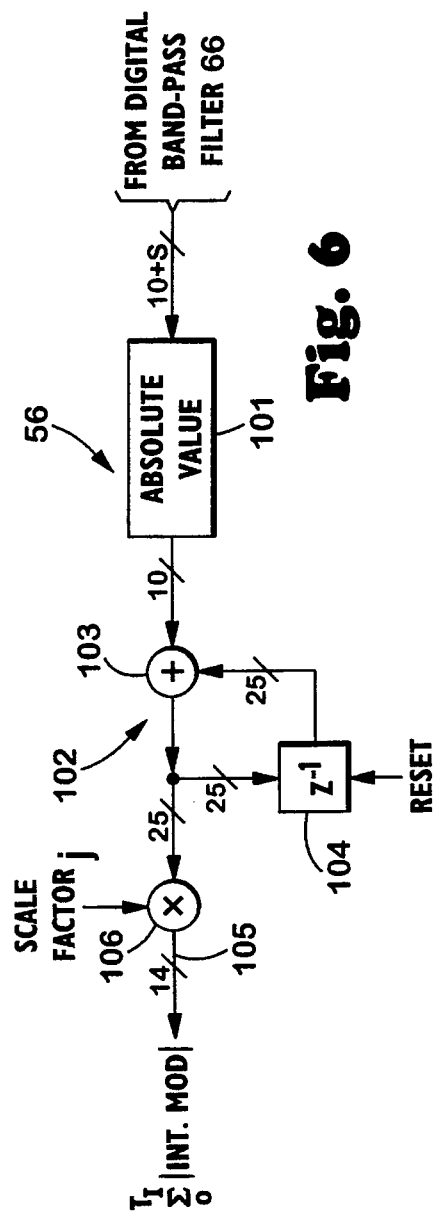
FIG. 6 is a schematic diagram of an amplitude detector introduced in FIG. 2 and which asynchronously detects an intermodulation component.

Turning now to FIG. 6, there is shown a schematic diagram of the amplitude detector 56 introduced in FIG. 2. The amplitude detector 56 includes an absolute value unit 101 having a construction depending on the particular number representation used. For example, if negative numbers are represented in "sign plus magnitude" format, then the absolute value unit simply discards the sign bit and passes the magnitude. If negative numbers are represented in "one's complement" or "two's complement" representation, then the absolute value unit may include a complement unit controlled by the sign bit to selectively complement the number, and the magnitude from the complement unit provides the absolute value. Such a complement unit is typically included in the "front end" of an arithmetic logic unit performing additions or subtractions. For the circuit shown in FIG. 6, for example, the addition 103 could be performed by such an arithmetic logic unit, and in this case, the absolute value 101 and adder 103 could be performed by such an arithmetic logic unit having an add/subtract control input receiving the sign bit(s) from the digital band-pass filter. In other words, in FIG. 6, when the digital band-pass filter provides a positive number to the circuit in FIG. 6, then this number is added to the result in the register 104 to compute the next value to be loaded back into the register 104, and when the digital band-pass filter provides a negative number to the circuit in FIG. 6, then this negative number is subtracted from the result in the register 104 to compute the next value to be loaded back into the register 104. The subtraction of a negative number gives the same result as the addition of the magnitude of the negative number, so that in either case, the output of the adder is the sum of the value in the register 104 and the absolute value of the output of the digital band-pass filter.

The adder 103 and register 104 comprise an accumulator for accumulating or averaging the magnitude of the samples from the digital band-pass filter 101. Other types of absolute value detectors, such as RMS detectors or energy detectors, could be used, but they are more complicated and are not warranted in this application. Accumulation over an integer number of half-cycles prevents the detected amplitude value from being dependent on the relative phase of the accumulation process with respect to the phase of the intermodulation component being detected. The register 104, for example, is initially reset at the beginning of the accumulation period.

Figure 7:
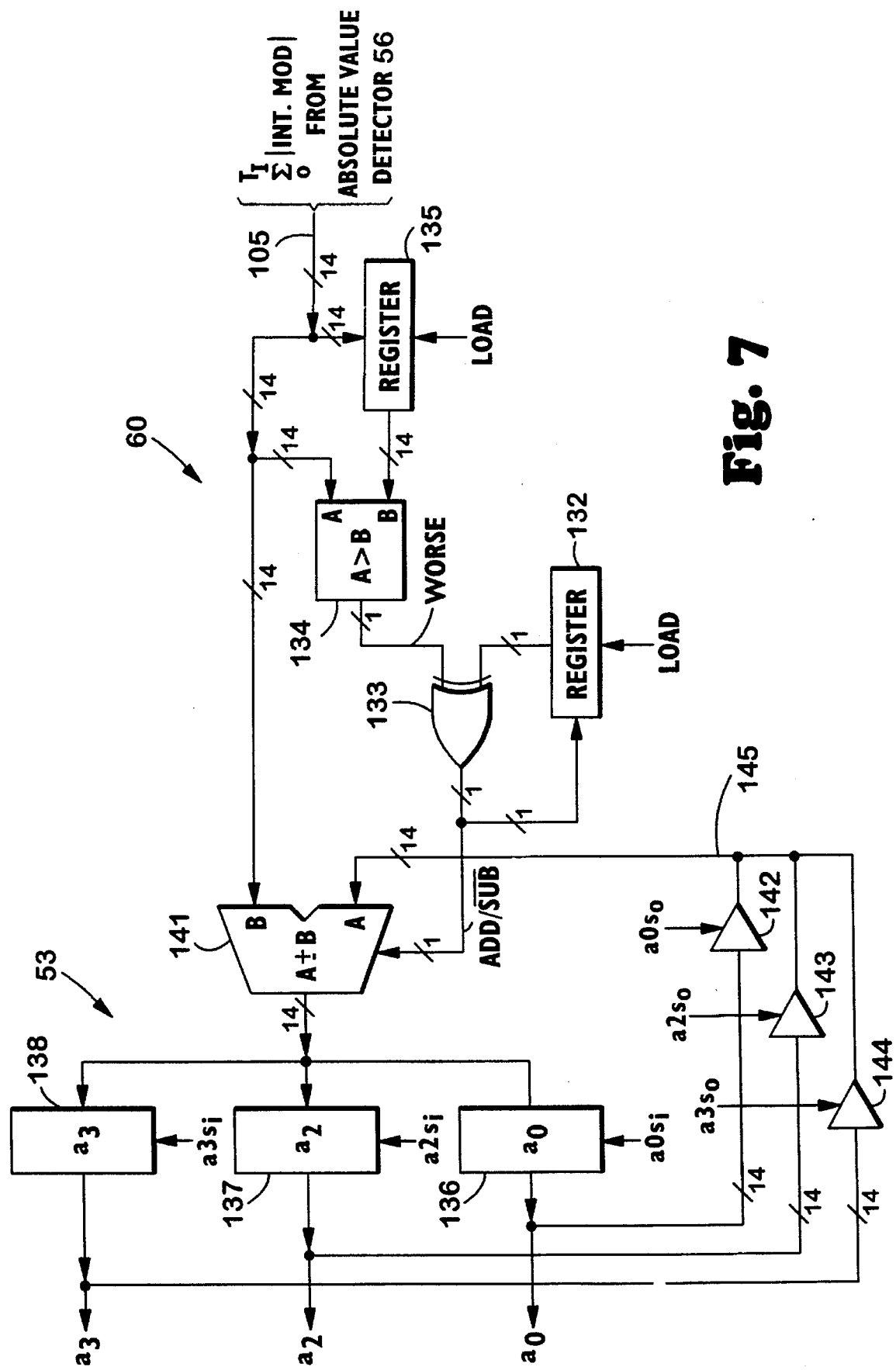
FIG. 7 is a schematic diagram of a polynomial coefficient generator and polynomial coefficient storage introduced in FIG. 2 and used with the asynchronous amplitude detector of FIG. 5.

The sum from the adder 103 of the accumulator 102 is scaled in a multiplier 106 by a predetermine scale factor, and passed over a bus 105 to the polynomial coefficient generator 60 shown in FIG. 7. The accumulator register 104 in FIG. 6 holds 25 bits, and after scaling by the multiplier, the fourteen most significant bits are passed to the bus 105.

The scale factor is chosen to maximize convergence, and its value is selected depending on the gain around the feedback loop in FIG. 2 for the polynomial coefficient being adjusted. In particular, the scale factor for the polynomial coefficient is chosen slightly less than an optimum amount that would make the predistortion exactly cancel the distortion in the forward loop after one iteration. The number of iterations required for convergence is dependent on how close the scale factor is set to the optimum amount.

Turning now to FIG. 7, there is shown a schematic diagram of the polynomial coefficient generator 60 to be used with the amplitude detector 56 of FIG. 5. As shown in FIG. 7, the 14-bit output of the absolute value detector on the bus 105 is received in an adder/subtractor unit 141 which either adds or subtracts the detected absolute value to the polynomial coefficient in a selected one of the polynomial coefficient storage registers 136, 137, 138 and loads the result back into the selected register. The output of a selected one of the registers 136, 137, 138 is selected by a respective one of the selection signals $a0s_o$, $a2s_o$, $a3s_o$, being asserted and thereby enabling a respective one of three tristate gates 142, 143, 144 to multiplex the polynomial coefficient from the selected register onto a bus 145 providing one of the inputs to the adder/subtractor 141. The output of the adder/subtractor 141 is loaded back into the selected one of the selected registers when a respective one of the register load signals $a0s_o$, $a2s_o$, $a3s_o$ is asserted.

Circuitry in FIG. 7 determines whether a new magnitude from the absolute value detector should be added or subtracted from the stored polynomial coefficient depending on whether an addition or subtraction was performed during the last iteration, and by checking whether the last change to the polynomial coefficient caused the magnitude to increase or decrease relative to the previous magnitude or magnitudes. A one-bit register 132 records whether an addition or subtraction was performed during the last iteration. An exclusive-OR gate 133 receives the output of the one-bit register to provide the add/subtract control signal to the adder/subtractor unit 141. A comparator 134 compares the absolute value from the bus 105 to the absolute value for the previous iteration, which is temporarily stored in a register 135.

If the absolute value on the bus 105 is decreasing, then the comparator 134 outputs a logic low, and the add/subtract control signal is not switched by the exclusive-OR gate. If the absolute value on the bus 105 is increasing, however, then the comparator 134 asserts a logic 1 and the exclusive OR gate switches the logic level of the add/subtract control signal. In this fashion, the polynomial coefficient is adjusted so as to reduce the detected intermodulation component to approximately zero. After a certain number of iterations, or after checking that the absolute value on the bus 105 is below a certain limit, the adjustment process is terminated. The final value of the polynomial coefficient is stored in a respective one of three registers 136, 137 and 138 in the polynomial coefficient storage 53. The residual value of the absolute value on the bus 105 upon termination of the adjustment process could also be stored for diagnostic purposes, such as reporting calibration errors, as described below with reference to FIG. 13.

Figure 8:
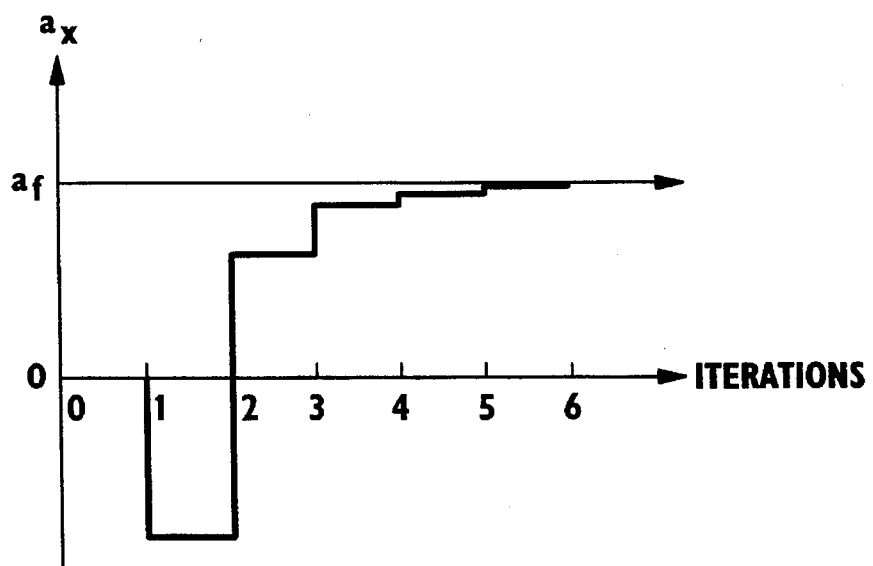
FIG. 8 is a graph illustrating convergence of a polynomial coefficient generated by the polynomial coefficient generator of FIG. 7.

Turning now to FIG. 8, there is shown a graph illustrating the convergence of a polynomial coefficient (a) to its final value ($a_f$) resulting from operation of the asynchronous amplitude detector 56 of FIG. 7 and the polynomial generator 60 of FIG. 8. The intermodulation product is at a frequency of approximately 4 Hz. The iteration time is on the order of 2 seconds per iteration. The scale factor in this example is set to 80% of its optimum value to better illustrate the convergence process. (In actual practice, the scale factor would be set to better than 90% of its optimum value.) Initially, the control signal to the adder/subtractor 141 was not in a state promoting convergence, causing the polynomial coefficient $a_x$ to be adjusted away from its desired final value $a_f$. Within five iterations, there is better than 50 dB reduction in the distortion (i.e., the difference between the adjusted value and the final value of the polynomial coefficient is 50 dB below the final value). If control signal to the adder/subtractor had been in an initial state promoting convergence, there would have been 56 dB of distortion reduction after 5 iterations. To further improve the distortion reduction, either a more optimum gain could be selected or more iterations could be performed. Transients in the feedback loop can be minimized by starting the two tones of the dual-tone oscillator 54 out of phase (i.e., one tone has an initial phase θ of zero and the other tone has an initial phase θ of π radians) so that the intermodulation component initially has a minimum value.

Figure 9:
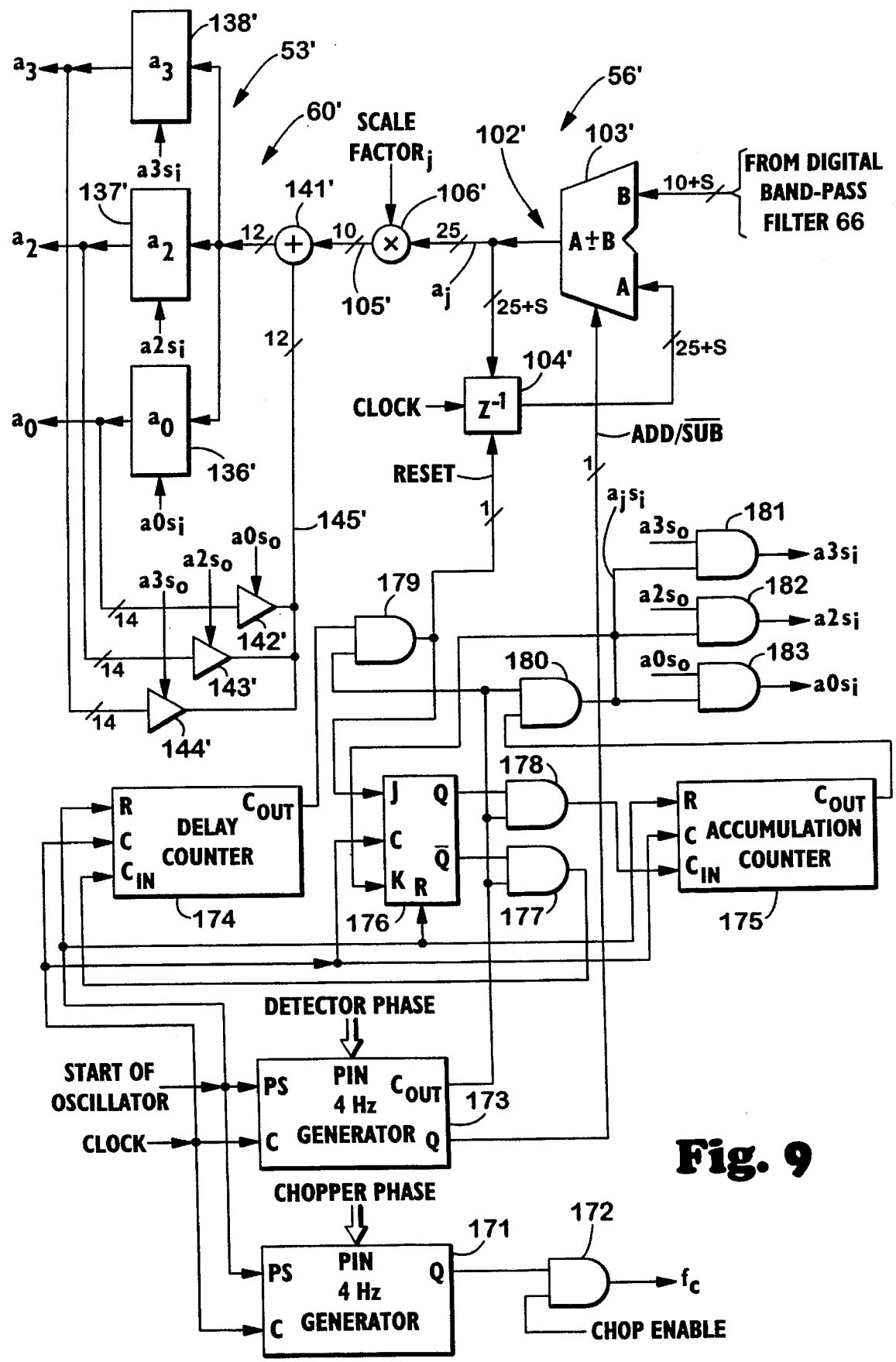
FIG. 9 is a schematic diagram of a synchronous amplitude detector, and a polynomial coefficient generator and polynomial coefficient storage for use with the synchronous amplitude detector.

Turning now to FIG. 9, there is shown a schematic diagram of a synchronous amplitude detector 56' and an associated polynomial coefficient generator 60' and polynomial coefficient storage 53', which could be used in lieu of the asynchronous amplitude detector 56 of FIG. 6 and its associated polynomial coefficient generator 60 and polynomial coefficient storage 53 of FIG. 7. Components in FIG. 9 that are similar to components in FIGS. 6 and 7 are denoted with similar but primed reference numerals.

The synchronous amplitude detector 56' requires knowledge of the phase of the intermodulation component to be detected. This knowledge is indicated by an "add/subtract" control signal to an adder/subtractor unit 103'. So long as the "add/subtract" control signal is synchronized to the intermodulation component, a proper sign and the magnitude of the intermodulation component will be accumulated in a register 194', and noise in the signal from the digital band-pass filter will be uncorrelated with the phase of the intermodulation component, thereby improving the detection signal-to-noise ratio.

The accumulator register 104' is initially reset, and is loaded in response to a clock at the sampling rate of the digital samples from the digital band-pass filter. After accumulation over an integral number of half-cycles at the 4 Hz frequency of the intermodulation component being detected, the accumulated result ($a_j$) is scaled in a multiplier 106' by a scale factor for a selected one of the polynomial coefficients. The polynomial coefficient is selected from a respective one of the registers 136', 137', 138' by a respective one of the selection signals $a0s_o$, $a2s_o$, $a3s_o$, being asserted and thereby enabling a respective one of three tristate gates 142', 143', 144' to multiplex the polynomial coefficient from the respective register onto a bus 145' providing one of the inputs to the adder 141'. The selected polynomial coefficient is adjusted by an adder 141'. which adds the scaled result from the multiplier 106' to the selected polynomial coefficient. The adjusted polynomial coefficient is then stored back in its respective one of the storage registers 136', 137', 138' in response to a respective one of the register strobe signals $a0s_i$, $a2s_i$, $a3s_i$.

In order to synchronize the add/subtract control signal to the 4 kHz intermodulation component, the circuit in FIG. 9 includes a number of digital delays that are enabled at the start of the dual-tone digital oscillator (54 in FIG. 4). At the beginning of the process of generating each polynomial coefficient, the dual-tone digital oscillator is reset, so that the intermodulation component has a predetermined initial phase. So long as the delay around the feedback loop is relatively fixed and has a variation no greater than a small fraction of a period of the intermodulation component, then the add/subtract signal can be generated by a digital divider that is properly synchronized to the resetting and enabling of the oscillator.

As shown in FIG. 9, for example, the digital delays are generated by synchronous logic that is synchronized to a common clock and reset by a reset pulse at the start of the digital oscillator (54 in FIG. 2). The common clock in this case is at a multiple of 4 Hz, so that the 4 Hz chopping signal $f_c$ can be generated by a first digital counter 171 and a gate 172, and the add/subtract control signal to the adder/subtractor 103' can be generated by a second digital counter 173.

As shown in FIG. 9, the counters 171 and 173 are presettable counters that are preset with selected initial values at the start of the digital oscillator (54 in FIG. 2). The second counter 173 is loaded with an initial value that determines the phase of the synchronous detector relative to the start of the digital oscillator (54 in FIG. 2). In particular, the add/subtract signal is synchronized to the 4 Hz intermodulation component, as shown in the timing diagram in FIG. 10. The first counter 171 is loaded with an initial value that determines the phase of the chopping signal $f_c$ relative to the start of the digital oscillator (54 in FIG. 2). The phase of the chopping signal $f_c$ determines the phase of the modulated signal from the switching modulator (58 in FIG. 2). When the chopping signal $f_c$ is enabled, the modulated signal from the switching modulator (58 in FIG. 2) must also be synchronized to the add/subtract signal in a fashion similar to the synchronization of the intermodulation component, as shown in the timing diagram in FIG. 10.

Figure 10:
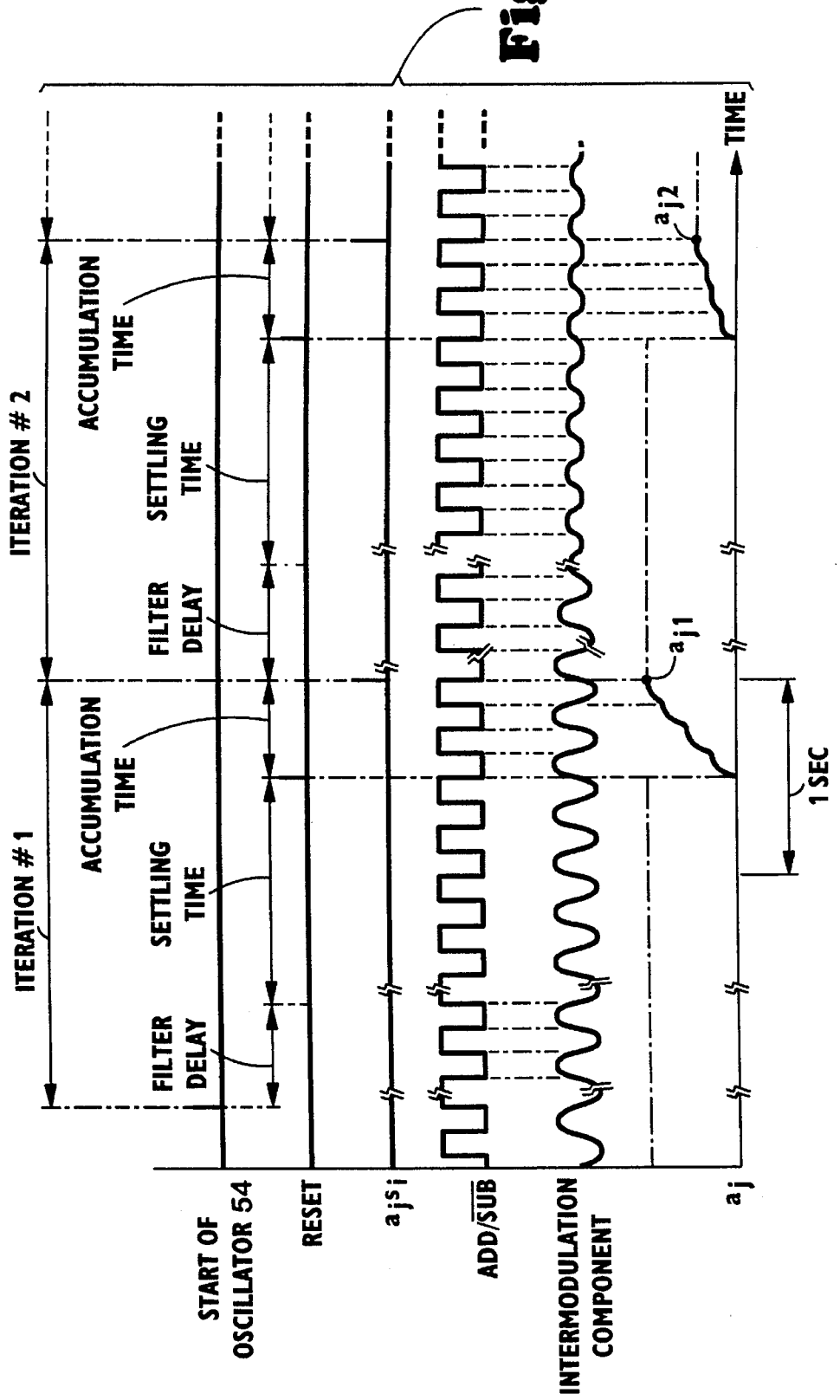
FIG. 10 is a timing diagram illustrating various signals in the synchronous detector circuits of FIG. 9.

As shown in FIG. 9, a delay counter 174 determines a delay time to account for filter delay and settling time, as shown in FIG. 10, and an accumulation counter 175 determines an accumulation time, as shown in FIG. 10. The state of a J-K flip-flop 176 enables counting by either the delay counter 174 at the beginning of an iteration or by the accumulation counter 175 at the end of an iteration. A set of four AND gates 177, 178, 179, 180 permits the counters 174 and 175 to count at a rate lower than the clock frequency; for example, the four AND gates 177, 178, 179, 180 are enabled by the carry-out signal ($C_{OUT}$) from the presettable counter 173 so that the counters 174 and 175 count at a 4 Hz rate when alternately enabled by the J-K flip-flop 176. For the example shown in the timing diagram of FIG. 10, the accumulation counter 175 counts up to two in order to accumulate over two cycles at the 4 Hz rate, and the delay counter 174 counts up to a larger number in order to provide a delay equal to filter delay (along the path through the multiplexer 55, polynomial generator 52, digital delta-sigma modulator 43, single-bit DAC 44, low-pass filter 45, driver 47, low-pass filter 57, switching modulator 58, the analog-to-digital converter 59, and the digital band-pass filter 66) plus settling time (sufficient for the intermodulation component to settle to a relatively constant amplitude).

The AND gate 179 gates the carry-out of the delay counter 174 to provide a reset signal to the accumulator register 104', and the AND gate 180 gates the carry-out of the accumulation counter 175 to provide a master strobe signal $ajs_i$. Respective AND gates 181, 182, 183 gate the master strobe signal $ajs_i$ with the respective polynomial coefficient selection signals $a0s_o$, $a2s_o$, $a3s_o$ to produce the respective strobe signals $a0s_i$, $a2s_i$, $a3s_i$. Therefore, during each iteration, the accumulator register 104' is reset and then accumulates values during an accumulation period, and at the end of the accumulation period, the selected polynomial coefficient is adjusted by the accumulated value. For example, as shown in FIG. 10, at the end of the accumulation period during the first iteration, the value $a_j$ in the accumulation register 104' is $a_{j1}$, and at the end of the accumulation period during the second iteration, the value $a_j$ in the accumulation register 104' is $a_{j2}$. The value $a_j$ in the accumulation register 104' during the filter delay and settling time is not relevant, because the register 104' is reset at the end of the settling time, and consequently the value $a_j$ in the register 104' is always zero at the beginning of the accumulation period.

Turning now to FIG. 11A, there is shown a schematic diagram of the switching modulator 58. In this case, the analog-to-digital converter 59 has a single-ended input 151. The switching modulator includes an NMOS transistor 152 and a PMOS transistor 152' connected between the terminal 65 and the input 151, and an NMOS transistor 153 and a PMOS transistor 153' shunting the input 151 to ground. The gates of the transistors 152 and 153' receive the chopping signal $f_c$, and the gates of the transistors 152' and 153 are connected to the output of an inverter 154 receiving the chopping signal.

Turning now to FIG. 11B, there is shown a schematic diagram of an alternative switching modulator 160 for use with an analog-to-digital converter 161 having complementary inputs 162 and 163. The switching modulator 160 has an NMOS transistor 164 and a PMOS transistor 164' connected between the terminal 65' and the positive input 162, and an NMOS transistor 165 and a PMOS transistor 165' connected between the positive input 162 and ground. The transistors 164 and 165' have their gates connected to receive the chopping signal $f_c$, and the transistors 164' and 165 have their gates connected to the output of an inverter 166 responsive to the chopping signal. The switching modulator 160 further includes an NMOS transistor 167 and a PMOS transistor 167' connected between the terminal 65' and the negative input 163, and an NMOS transistor 168 and a PMOS transistor 168' connected between the negative input 163 and ground. The transistors 167 and 168' have their gates connected to the output of the inverter 166, and the transistors 167' and 168 have their gates connected to receive the chopping signal $f_c$. Therefore, both the positive and negative inputs 162, 163 of the analog-to-digital converter 161 are periodically switched at the chopping frequency $f_c$ between the terminal 65' and ground.

Figure 12A:
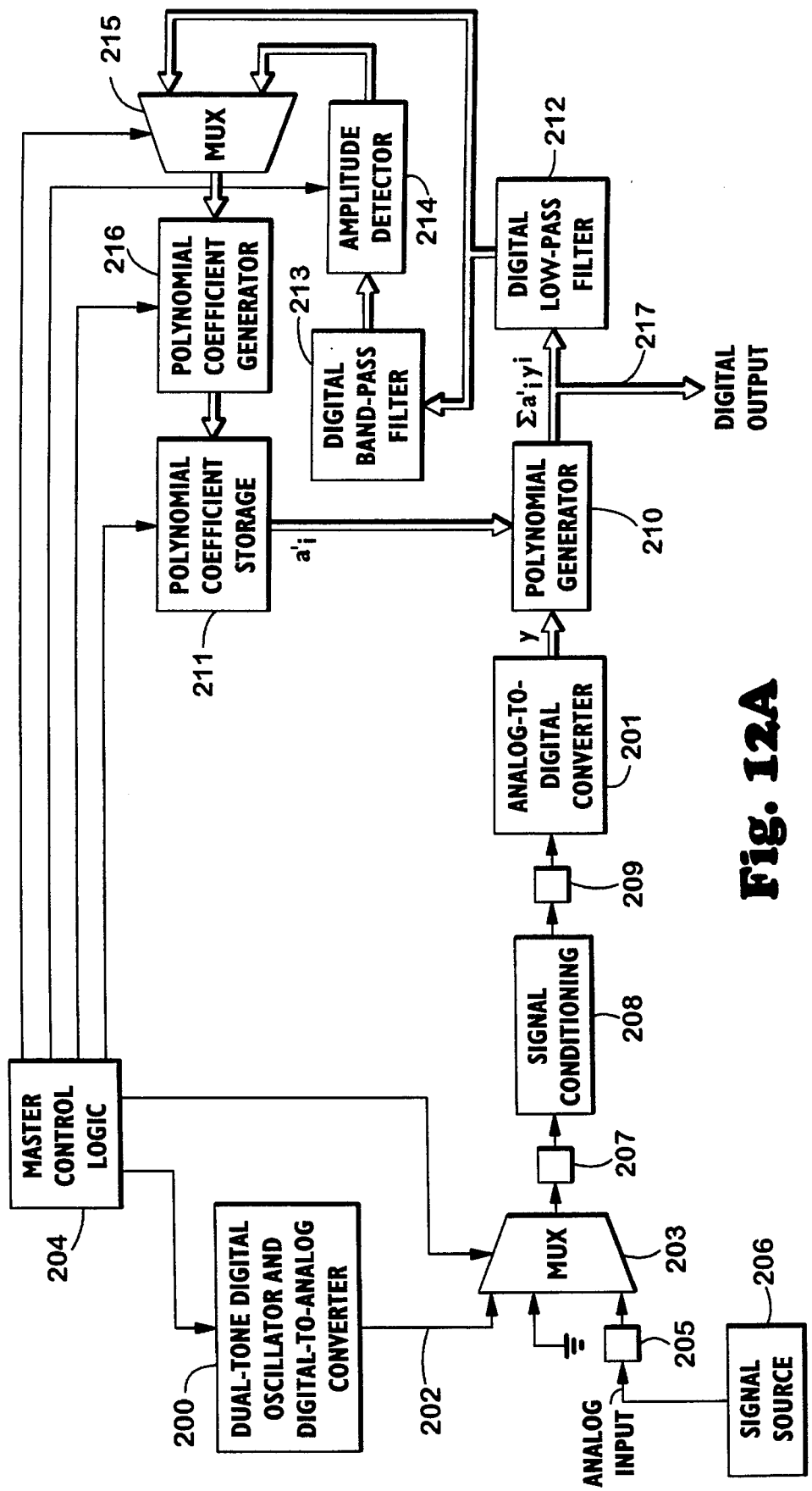
FIG. 12A is a block diagram of a first embodiment of an analog-to-digital converter including circuitry for digital compensation of nonlinearity.

Turning now to FIG. 12A, there is shown a schematic diagram of an analog-to-digital converter system including a dual-tone digital oscillator and calibrated digital-to-analog converter 200 for calibrating the analog-to-digital converter system. The dual-tone digital oscillator and digital-to-analog converter 200 include components similar to the components shown in FIG. 2, which are used as described above for calibrating the digital-to-analog converter to be ultralinear prior to calibration of the analog-to-digital converter system. The analog-to-digital converter system has a forward signal path including an analog input multiplexer 203, signal conditioning 208 (which may or may not be needed in any particular application), an analog-to-digital converter 201, and a polynomial generator 210. Preferably the analog-to-digital converter 201 is a delta-sigma converter including a delta sigma modulator generating a one-bit data stream at a high rate, and a digital decimating filter responsive to the one-bit data stream at the high rate for producing a multi-bit digital output at a lower rate.

For calibrating the analog-to-digital converter system of FIG. 12A, the components in box 200 generate an analog signal 202 including a pair of very precise sinusoidal signals. This is possible because the digital-to-analog converter in the box 200 has been calibrated as described above to correct any nonlinearity.

During a normal mode of operation, the analog input multiplexer 203 is operated by master control logic 204 to select an analog input signal on a terminal 205. The master control logic, for example, is a programmed microprocessor. As shown in FIG. 12A, the analog input signal is provided by a signal source 206. Typical signal sources include a geophone, a hydrophone, a microphone, a strain gauge, or a transducer such as a pressure transducer.

The signal selected by the multiplexer 203 is provided to a terminal 207 to which a signal conditioning circuit 208 is connected. The signal conditioning circuit 208, for example, is an amplifier, filter or transducer. The components shown in FIG. 12A other than the signal conditioning circuit 208 and the dual-tone oscillator 200 preferably are fabricated on a single monolithic semiconductor integrated circuit chip. The signal conditioning circuit 208 has an output connected to a terminal 209. The terminal 209 is connected to the input of the analog-to-digital converter 201. The output (y) of the analog-to-digital converter 201 is provided to a polynomial generator 210 that also receives polynomial coefficients $a'_i$ from polynomial coefficient storage 211. A polynomial generator 210 generates a polynomial $\Sigma a'_i y^i$ that is a corrected digital output 217 of the analog-to-digital converter 201.

The polynomial coefficients $a'_i$ are generated in a fashion analogous to the polynomial coefficients $a_i$ generated in the system of FIG. 2. In other words, the polynomial coefficients $a'_i$ are generated to correct any nonlinearity in the combination of the signal conditioning circuit 208 and the analog-to-digital converter 201 by detecting harmonic or intermodulation components and adjusting the polynomial coefficients to minimize these harmonic or intermodulation components.

The digital output of the polynomial generator 210 is filtered by a digital low-pass filter 212 to obtain a digital signal analogous to the digital signal from the analog-to-digital converter 59 in FIG. 2. The digital low-pass filter 212, for example, has a cut-off frequency of about 4 Hz. The digital low-pass filter could also decimate the digital samples at the digital output 217. For example, if the sampling rate at the digital output were 4,048 Hz, then the digital low-pass filter could decimate to a rate of 64 Hz. The output of the digital low-pass filter 212 is provided to a digital band-pass filter 213 and an amplitude detector 214 for detecting 4 Hz intermodulation components. The output of the digital low-pass filter 212 is also provided to a bypass multiplexer 215. The digital band-pass filter 213 and the amplitude detector 214 are similar or identical to the amplitude detector 56 and the digital band-pass filter 66 of FIG. 2. The output of the amplitude detector 214 is received by the bypass multiplexer 215. The output of the multiplexer 215 is received by a polynomial coefficient generator 216 which generates the polynomial coefficients that are stored in the polynomial coefficient storage 211. The polynomial coefficient generator 216 is similar or identical to the polynomial coefficient generator 60 shown in FIG. 2.

In operation, during an ADC calibration mode, the master control 204 first operates the multiplexer 203 to select a ground or zero voltage level and apply the zero voltage level to the terminal 207 in order to generate the polynomial coefficient $a'_0$. Alternatively, the analog input multiplexer 203 could select the output of the dual-tone digital oscillator, and the master control could load zero values into the digital oscillator, so that the digital oscillator would output a zero voltage level to the analog input multiplexer, which would appear on the terminal 207. The master control 204 also controls the bypass multiplexer 215 to bypass the digital band-pass filter 213 and the amplitude detector 214 by selecting the output of the digital low-pass filter 212. The polynomial coefficient generator 216 adjusts the polynomial coefficient $a'_0$ in response to the value from the amplitude detector 214 and provides the adjusted value to the polynomial generator. Due to the feedback loop including the components 210, 211, 212, 215 and 216, the polynomial coefficient $a'_0$ converges to a final value such that the digital output 217 of the polynomial generator 210 is zero. Generation of the polynomial coefficient $a'_0$ is therefore finished, and its final value is stored in the polynomial coefficient storage 211.

In order to generate the second-order polynomial coefficient $a'_2$, the master control logic 204 sets the digital oscillator to frequencies of 500 Hz and 496 Hz, each having an amplitude of a little below one-half of full scale. For an initial value of $a'_2$ equal to zero, any second-order nonlinearity in the combination of the signal conditioning circuit 208 and the analog-to-digital converter 201 causes a 4 Hz intermodulation component to appear in the digital output 217. The digital low-pass filter 212 passes any 4 Hz intermodulation component, but rejects the 500 and 496 Hz tones, and any harmonics or other intermodulation components. Any 4 Hz intermodulation component is selected by the digital band-pass filter 213 and detected by the amplitude detector 214. The master control logic 204 controls the bypass multiplexer 215 to select the output of the amplitude detector 214 and to pass this output to the polynomial coefficient generator 216. The polynomial coefficient generator 216 adjusts the second-order polynomial coefficient $a'_2$ so as to eliminate any detected 4 Hz component. During this time, and from this point on, the polynomial generator 210 multiplies the coefficient $a'_2$ by the square of the input signal (y) and adds the product to the input (y), to form the polynomial signal that provides the digital output 217.

For generating the third-order coefficient $a'_3$, the master control 204 sets the digital oscillator 200 to frequencies of 500 Hz and 248 Hz, each having an amplitude of a little below one-half of full scale. For an initial value of $a'_3$ equal to zero, any third-order non-linearity in combination of the signal conditioning circuits 208 and the analog-to-digital converter 201 causes a 4 Hz intermodulation component to appear in the digital output 217. Any 4 Hz intermodulation component passes through the digital low-pass filter 212 and is selected by the digital band-pass filter 213 and detected by the amplitude detector 214. The output of the amplitude detector 214 is selected by the multiplexer 215 and is passed to the polynomial coefficient generator 216. The polynomial coefficient generator 216 adjusts the third-order polynomial coefficient $a'_3$ so as to eliminate any detected 4 Hz component. During this time, and from this point on, the polynomial generator 210 multiplies the coefficient $a'_3$ by the cube of the input signal (y) and adds the product to the input (y), to form the digital output 217.

This procedure could be continued to correct for fourth and higher-order nonlinearity by appropriate selection of frequencies of the digital oscillator 200, but correction of such higher-order nonlinearity would typically not be necessary in the system of FIG. 12A.

Finally, the master control 204 controls the analog input multiplexer 203 to select the analog input 205. This completes the procedure for calibrating the analog-to-digital converter system. It is also possible for the dual-tone digital oscillator and digital-to-analog converter to simultaneously calibrate a plurality of analog-to-digital converters by following this procedure. For simultaneous calibration, the components 203, 201, 210, 211, 212, 213, 214, 215, and 216 would be duplicated for each analog-to-digital converter. In this case, the zero-order coefficients would be computed simultaneously for the plurality of analog-to-digital converters, then the second-order coefficients would be computed simultaneously, and then the third-order coefficients would be computed simultaneously. Such an array of calibrated analog-to-digital converters would be useful for converting geophone signals for seismic exploration.

After calibration of the analog-to-digital conversion system in FIG. 12A to compensate for non-linearity, the polynomial coefficients in the storage 211 could be adjusted to obtain a desired non-linear response. The desired non-linear response could be selected for a desired degree of compression or de-compression of the analog input signal. The desired non-linear response could also be used to cancel distortion in the signal source. For example, the nonlinearity of transducers such as geophones, hydrophones, microphones, strain gauges and pressure transducers can be expressed as a polynomial, and this nonlinearity can be corrected by subtracting the coefficients of this polynomial from the respective coefficients in the storage 211 and storing the adjusted coefficients in the storage 211.

Figure 12B:
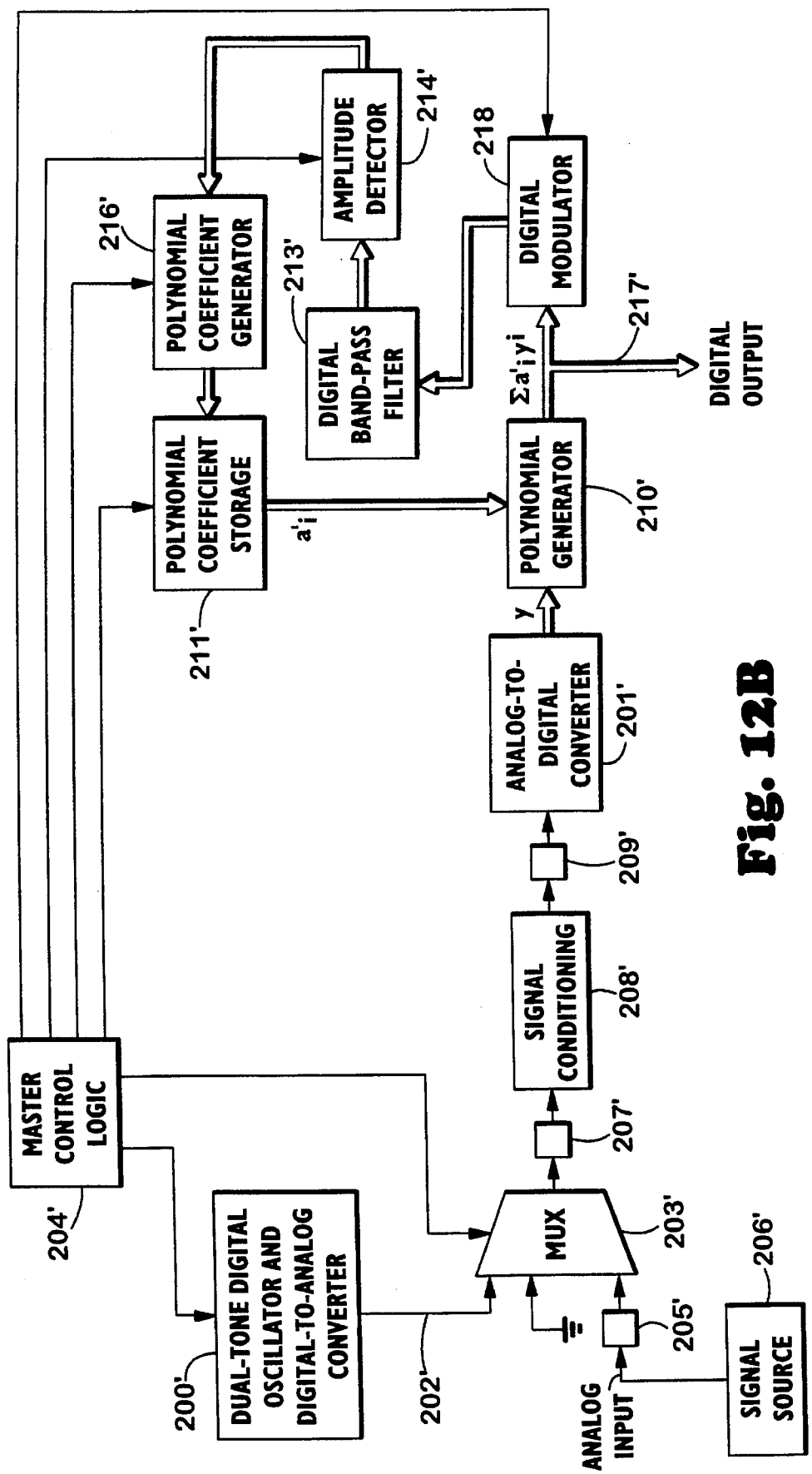
FIG. 12B is a block diagram of a second embodiment of an analog-to-digital converter including circuitry for digital compensation of nonlinearity.

Turning now to FIG. 12B, there is shown a schematic diagram of an alternative analog-to-digital converter system including a dual-tone digital oscillator and calibrated digital-to-analog converter 200' for calibrating the analog-to-digital converter system. The system is similar to the system in FIG. 12A, and similar components are designated with similar but primed reference numerals. It should be apparent that the digital low-pass filter 212 of FIG. 12A has been replaced by a digital modulator 218 in FIG. 12B, and the system of FIG. 12B does not have a multiplexer similar to the multiplexer 215 of FIG. 12A. The operation of the system in FIG. 12B is similar to the operation of the system in FIG. 12A, except that when the multiplexer 215 of FIG. 12A selects the output of the amplitude detector 214 in FIG. 12A, the corresponding operation in the system of FIG. 12B is for the master control logic 204' to disable the digital modulator 218, and when the multiplexer 215 of FIG. 12A selects the output of the digital low-pass filter 12, the corresponding operation in the system of FIG. 12B is for the master control logic 204' to enable the digital modulator. These differences between the system of FIG. 12A and the system of FIG. 12B primarily relate to the calibration of the analog-to-digital conversion in the system of FIG. 12B.

For calibrating the analog-to-digital converter system of FIG. 12B, the components in box 200' generate an analog signal 202' including a pair of very precise sinusoidal signals. This is possible because the digital-to-analog converter in the box 200' has been calibrated as described above to correct any nonlinearity.

During a normal mode of operation, the analog input multiplexer 203' is operated by the master control logic 204' to select an analog input signal on a terminal 205'. As shown in FIG. 12B, the analog input signal is provided by a signal source 206'. The signal selected by the multiplexer 203 is provided to a terminal 207' to which a signal conditioning circuit 208' is connected. The signal conditioning circuit 208' has an output connected to a terminal 209'. The terminal 209' is connected to the input of the analog-to-digital converter 201'. The output (y) of the analog-to-digital converter 201' is provided to a polynomial generator 210' that also receives polynomial coefficients $a'_i$ from polynomial coefficient storage 211'. A polynomial generator 210' generates a polynomial $\Sigma a'_i y^i$ that is a corrected digital output 217' of the analog-to-digital converter 201'.

When computing the coefficient $a'_o$, the digital output of the polynomial generator 210' is modulated by the digital modulator 218 to obtain a digital signal analogous to the digital signal from the analog-to-digital converter 59 in FIG. 2. The output of the digital modulator 218 is provided to a digital band-pass filter 213' and an amplitude detector 214' for detecting the modulated dc component for computing the $a'_o$ coefficient or for detecting the 4 Hz intermodulation components for computing the $a'_2$ and $a'_3$ coefficients (and any higher order coefficients if used in the system). The digital band-pass filter 213' and the amplitude detector 214' are similar or identical to the amplitude detector 56 and the digital band-pass filter 66 of FIG. 2. The output of the amplitude detector 214' is received by a polynomial coefficient generator 216' which generates the polynomial coefficients that are stored in the polynomial coefficient storage 211'. The polynomial coefficient generator 216' is similar or identical to the polynomial coefficient generator 60 shown in FIG. 2.

In operation, during an ADC calibration mode, the master control 204' first operates the multiplexer 203' to select a ground or zero voltage level and apply the zero voltage level to the terminal 207' in order to generate the polynomial coefficient $a'_0$. Alternatively, the analog input multiplexer 203' could select the output of the dual-tone digital oscillator, and the master control could load zero values into the digital oscillator, so that the digital oscillator would output a zero voltage level to the analog input multiplexer, which would appear on the terminal 207'. The master control 204' also controls the digital modulator 218 to modulate the zero input voltage digital signal at the center frequency of the band-pass filter 213'. The polynomial coefficient generator 216' adjusts the polynomial coefficient $a'_o$ in response to the value from the amplitude detector 214' and provides the adjusted value to the polynomial generator. Due to the feedback loop including the components 210', 211', 212', 213', 214', and 216' the polynomial coefficient $a'_0$ converges to a final value such that the digital output 217' of the polynomial generator 210' is zero. Generation of the polynomial coefficient $a'_0$ is therefore finished, and its final value is stored in the polynomial coefficient storage 211'.

In order to generate the second-order polynomial coefficient $a'_2$, the master control logic 204' sets the digital oscillator to frequencies of 500 Hz and 496 Hz, each having an amplitude of a little below one-half of full scale For an initial value of $a'_2$ equal to zero, any second-order non-linearity in the combination of the signal conditioning circuit 208' and the analog-to-digital converter 201' causes a 4 Hz intermodulation component to appear in the digital output 217', The master control logic 204' controls the digital modulator 218 to pass all signals without modification from the digital output 217' to the digital band-pass filter 213'. The digital low-pass filter 212' passes any 4 Hz intermodulation component, but rejects the 500 and 496 Hz tones, and any harmonics or other intermodulation components. Any 4 Hz intermodulation component is selected by the digital band-pass filter 213' and detected by the amplitude detector 214'. The output of the amplitude detector 214' is received by the polynomial coefficient generator 216'. The polynomial coefficient generator 216' adjusts the second-order polynomial coefficient $a'_2$ so as to eliminate any detected 4 Hz component. During this time, and from this point on, the polynomial generator 210' multiplies the coefficient $a'_2$ by the square of the input signal (y) and adds the product to the input (y), to form the polynomial signal that provides the digital output 217'.

For generating the third-order coefficient $a'_3$, the master control 204' sets the digital oscillator 200' to frequencies of 500 Hz and 248 Hz, each having an amplitude of a little below one-half of full scale For an initial value of $a'_3$ equal to zero, any third-order non-linearity in combination of the signal conditioning circuits 208' and the analog-to-digital converter 201' causes a 4 Hz intermodulation component to appear in the digital output 217'. Any 4 Hz intermodulation component passes through the digital low-pass filter 212' and is selected by the digital band-pass filter 213' and detected by the amplitude detector 214'. The output of the amplitude detector 214' is selected by the multiplexer 215' and is passed to the polynomial coefficient generator 216'. The polynomial coefficient generator 216' adjusts the third-order polynomial coefficient $a'_3$ so as to eliminate any detected 4 Hz component. During this time, and from this point on, the polynomial generator 210' multiplies the coefficient $a'_3$ by the cube of the input signal (y) and adds the product to the input (y), to form the digital output 217'.

This procedure could be continued to correct for fourth and higher-order nonlinearity by appropriate selection of frequencies of the digital oscillator 200, but correction of such higher-order nonlinearity would typically not be necessary in the system of FIG. 12B.

Finally, the master control 204' controls the analog input multiplexer 203' to select the analog input 205'. This completes the procedure for calibrating the analog-to-digital converter system in FIG. 12B. It is also possible for the dual-tone digital oscillator and digital-to-analog converter to simultaneously calibrate a plurality of analog-to-digital converters by following the procedure just described with reference to FIG. 12B. Moreover, after calibration of the analog-to-digital conversion system in FIG. 12B to compensate for non-linearity, the polynomial coefficients in the storage 211 could be adjusted as described above with reference to FIG. 12A to obtain a desired non-linear response.

Figure 13:
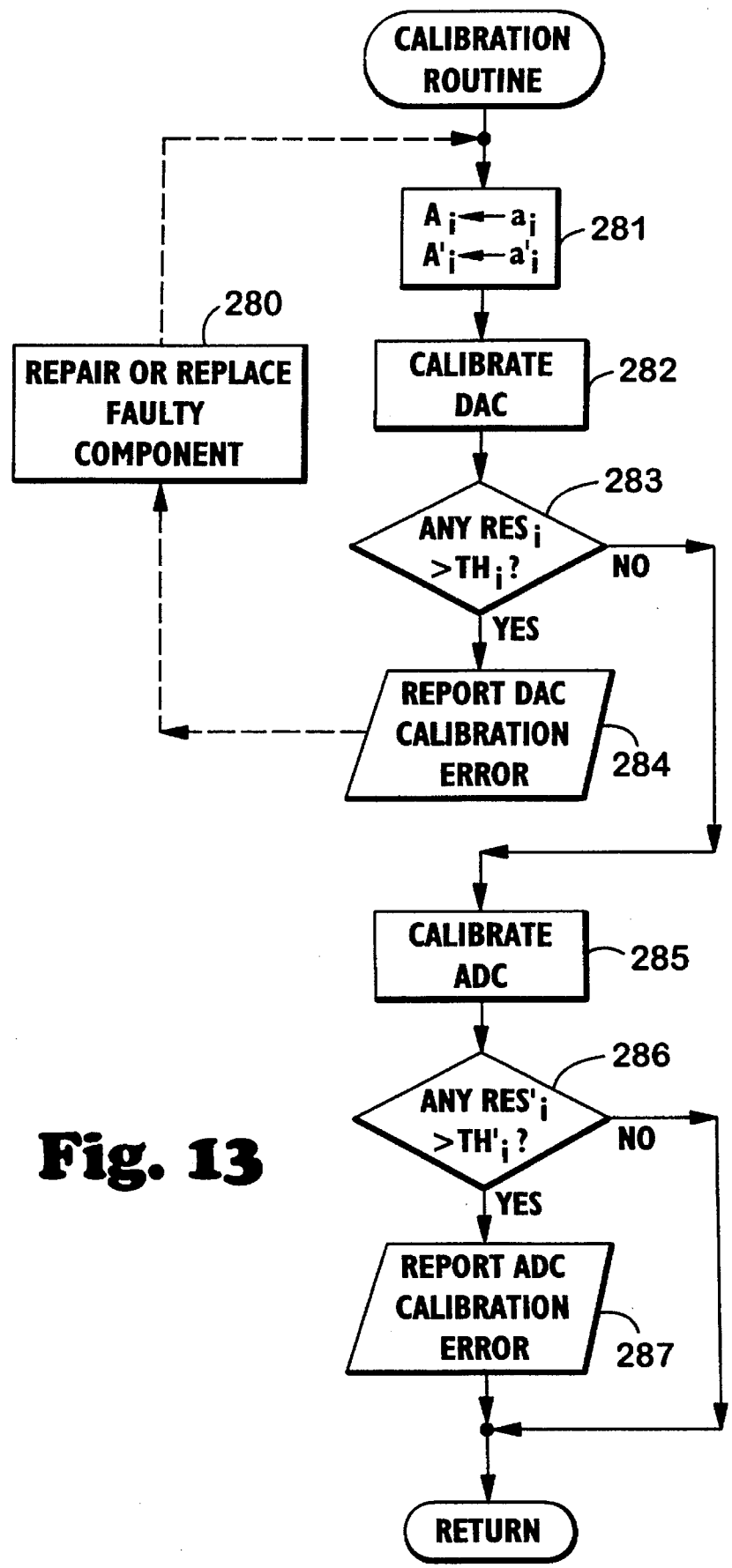
FIG. 13 is a flowchart of a routine for calibrating the analog-to-digital converter of FIG. 12A or FIG. 12B and reporting calibration errors.

Turning now to FIG. 13, there is shown a flowchart of a routine that could be used by the master control 204 of FIG. 12A or the master control 204' of FIG. 12B for calibrating the digital-to-analog converter 200 and the analog-to-digital converter 201 in FIG. 12A or for calibrating the digital-to-analog converter 200' and the analog-to-digital converter 201' in FIG. 12B. In a first step 281, the master control saves the initial values of the polynomial coefficients $a_i$ and $a'_i$ for the digital-to-analog converter and the analog-to-digital converter, respectively. These saved values are used in FIG. 14 for linearity checking, as described below. Then in step 282, the master control performs the procedure described above with respect to FIG. 2 to calibrate the digital-to-analog conversion. Next, in step 283, the residual value $RES_i$ of the amplitude detected by the amplitude detector 56 at the end of adjustment of each of the coefficients $a_0$, $a_2$, $a_3$ is compared to a respective threshold $TH_i$. If the residual for any of the coefficients exceeds the respective threshold, then in step 284 a DAC calibration error is reported to a human operator or to a computer to which the converter system is connected. As indicated by the dotted line path from step 284, execution does not continue until the component causing the error is repaired or replaced in step 280 and the calibration is restarted in step 281. If in step 283 the residual for each of the coefficients does not exceed the respective threshold, then execution branches directly to step 285.

In step 285, the master control performs the procedure described above with respect to FIG. 12A or FIG. 12B to calibrate the analog-to-digital conversion. Next, in step 286, the residual value $RES'_i$ of the amplitude detected by the amplitude detector (214 in FIG. 12A or 214' in FIG. 12B) at the end of adjustment of each of the coefficients $a'_0$, $a'_2 a'_3$ is compared to a respective threshold $TH'_i$. If the residual for any of the coefficients exceeds the respective threshold, then in step 287 an ADC calibration error is reported to a human operator or to a computer to which the converter system is connected, and execution of the calibration routine is finished.

Figure 14:
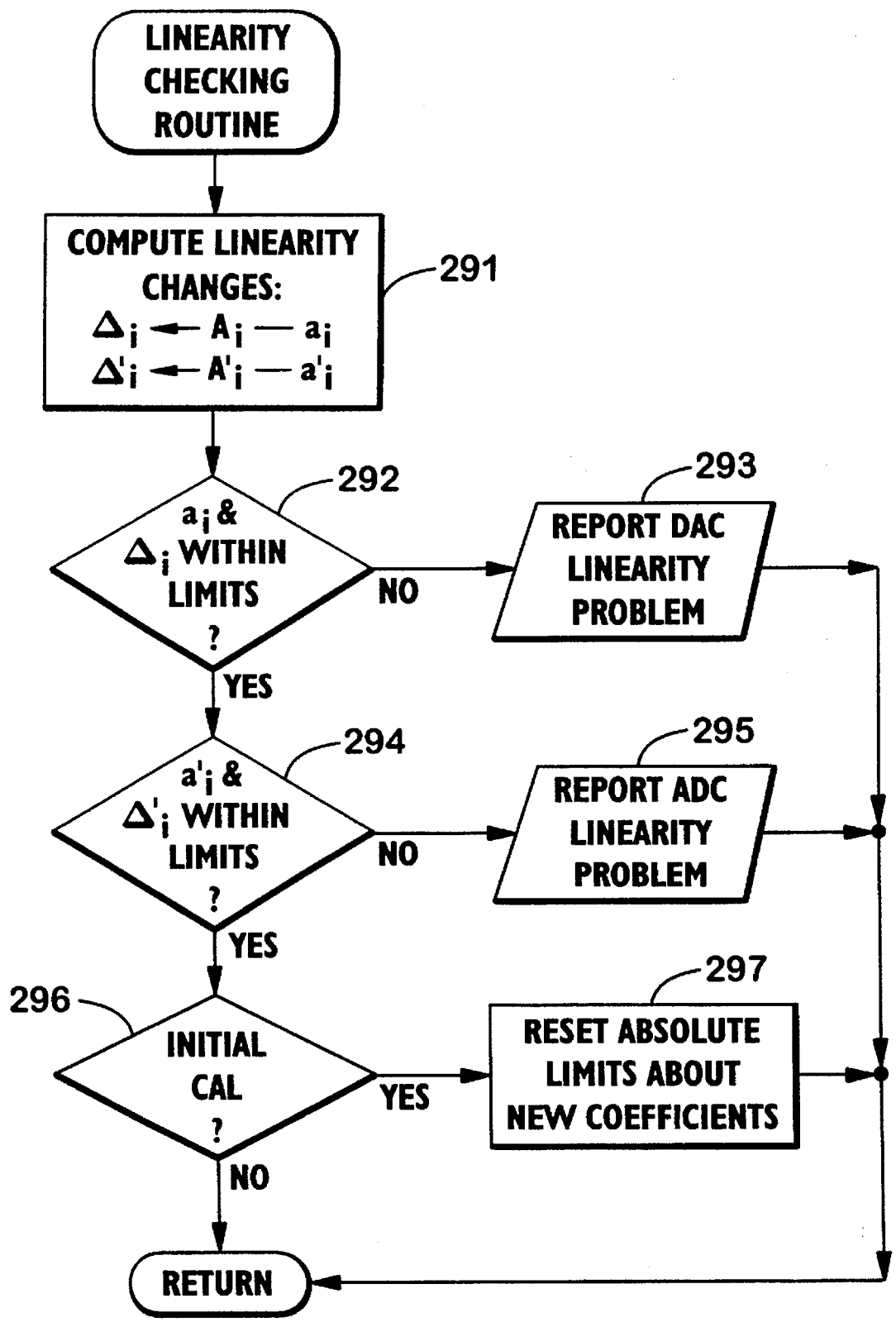
FIG. 14 is a flow chart of a linearity checking routine for detecting problems by monitoring deviations or changes in nonlinearity of the converters or in signal-conditioning circuitry that is digitally compensated in combination with the converters.

Turning now to FIG. 14, there is shown a flowchart of a subroutine for checking the linearity of the DAC and ADC conversion processes in system of FIG. 12A or FIG. 12B, and reporting significant changes in the linearity. In a first step 291 linearity changes $\Delta_i$ and $\Delta'_i$ since the last calibration are computed as the respective differences between the initial polynomial coefficients $A_i$, $A'_i$ and the new polynomial coefficients $a_i$, $a'_i$. In step 292 the DAC polynomial coefficients $a_i$ and changes $\Delta_i$ are compared to respective absolute and "drift" limits. The "drift" limits could depend on the time since the last calibration of the converters. In step 292, for example, the polynomial coefficients are compared directly to the absolute limits, and the magnitudes of the changes $\Delta_i$ are compared to the drift limits. If a limit is exceeded, then in step 293 a DAC linearity problem is reported to the operator or to the computer to which the converter system is connected. Excessive nonlinearity or changes in nonlinearity are particularly sensitive to abnormal conditions and problems with the circuitry being calibrated. For example, for the system shown in FIG. 2, overload of the driver 47 generates pronounced second, third, and higher-order nonlinearities. The driver 47, for example, has thermal overload circuitry which may sharply limit the driver's output current during an overload condition. After step 293, the calibration routine is finished.

If in step 292 the master control finds that the DAC polynomial coefficients $a_i$ and changes $\Delta_i$ are within the limits, then in step 294 the master control checks whether the ADC polynomial coefficients $a'_i$ and changes $\Delta'_i$ are within certain limits. If not, then in step 295, an ADC linearity problem is reported to the operator or to the computer to which the converter system is connected. After step 295, the calibration routine is finished.

If in step 294 it is found that the ADC polynomial coefficients $a'_i$ and changes $\Delta'_i$ are within certain limits, then in step 296 the master control checks a flag to determine whether the calibration is an initial calibration, for example, during a final test at the factory or during installation of the converter system. If so, then in step 297, the absolute limits are reset about the new coefficients just determined during the initial calibration. For example, during an initial calibration, steps 292 and 293 compare the polynomial coefficients to design limits based on the device-to-device tolerances. After the initial calibration, the system may be periodically re-calibrated to correct for changes in linearity and to diagnose system problems. The subsequent testing may use more stringent absolute limits based on the actual device parameters that are measured during the initial calibration, with the reasonable expectation that the converters should be within these more stringent absolute limits for the expected lifetime of the converters. After step 297, the calibration routine is finished. The calibration routine is also finished in step 296 if the calibration is not an initial calibration.

Figure 15:
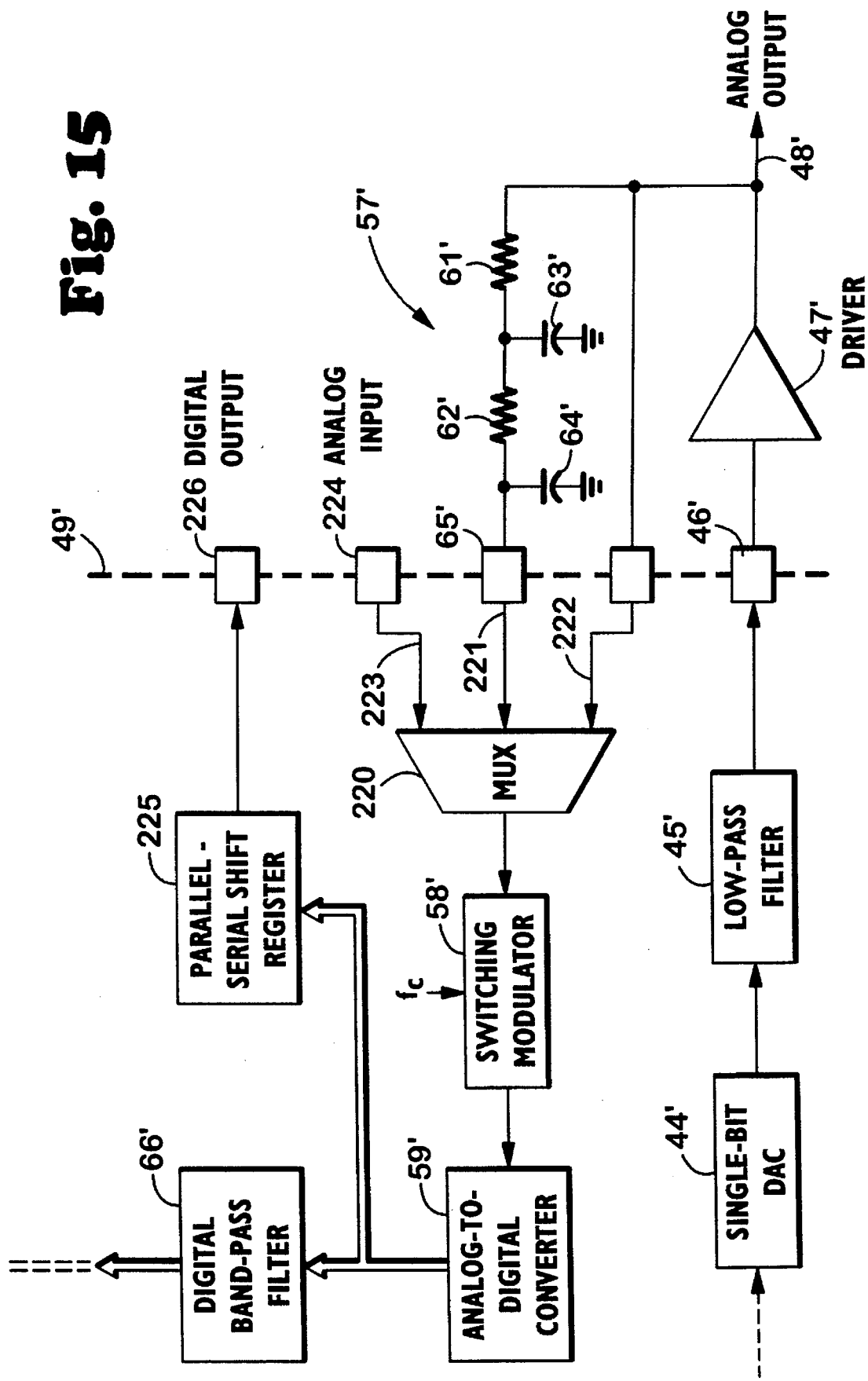
FIG. 15 is a block diagram of modifications that could be made to the block diagram of FIG. 2 in order to use the technique illustrated in FIG. 12A or FIG. 12B for digitally correcting nonlinearity of the analog-to-digital converter used in FIG. 2.

Turning now to FIG. 15, there is shown a block diagram of modifications that could be made to the block diagram of FIG. 2 in order to use the technique illustrated in FIG. 12A or FIG. 12B for digitally correcting nonlinearity of the analog-to-digital converter 59 used in FIG. 2. Components in FIG. 15 that are similar to components in FIG. 2 are designated with similar but primed referenced numerals.

As shown in FIG. 15, a three input multiplexer 220 has been inserted between the terminal 65' and the switching modulator 58'. During digital-to-analog converter calibration as described above with reference to FIG. 2, the multiplexer 220 selects the input 221 so that the switching modulator 58' receives a signal from the terminal 65'. During calibration of the analog-to-digital converter 59' as described above with reference to FIG. 12A or FIG. 12B, the multiplexer 220 selects the input 222 so that the switching modulator 58' is connected to the analog output 48'. The analog-to-digital converter 59', for example, includes components similar to the components 201, 210, 211, 212, 213, 214, 215, and 216 shown in FIG. 12A. After the analog-to-digital converter 59' has been calibrated, it can be used to re-calibrate the digital-to-analog converter, as will be further described below with reference to FIG. 16.

The multiplexer 220 has a third input 223 so that the switching modulator 58' may be connected to an analog input 224. After the analog-to-digital converter 59' has been calibrated, it can be used to convert the analog signal on the analog input 224. The converted signal is received in a parallel-serial shift register 225 and transmitted to a digital output terminal 226.

Figure 16:
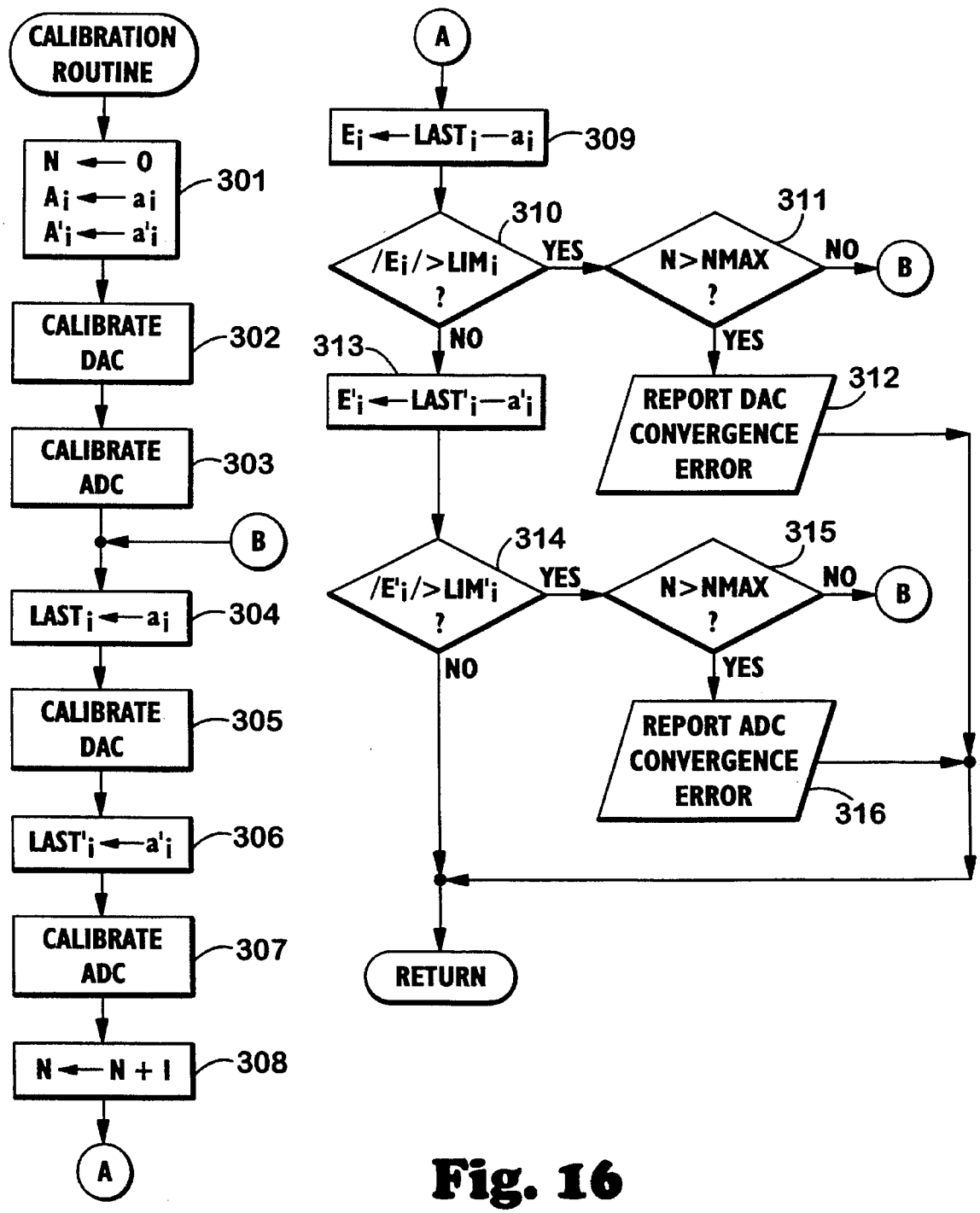
FIG. 16 is a flow chart of a calibration routine for alternately and iteratively calibrating an analog-to-digital converter and a digital-to-analog converter in a system such as the system of FIG. 2 as modified as shown in FIG. 15 to digitally correct nonlinearity.

Turning now to FIG. 16, there is shown a flow chart of an iterative calibration routine performed by a master control in a converter system such as the system of FIG. 2 modified as shown in FIG. 15. In a first step 301, the master control clears an iteration counter N, and saves the initial values of the polynomial coefficients $a_i$ and $a'_i$. These saved values could be used later by the routine of FIG. 14 for diagnosing and reporting linearity problems. Then in step 302, the master control performs the procedure described above with respect to FIG. 2 to calibrate the digital-to-analog conversion. In step 303, the master control performs a procedure as described above with respect to FIG. 12A or FIG. 12B to calibrate the analog-to-digital conversion. In step 304, the master control saves the values of the polynomial coefficients $a_i$ in a storage array $LAST_i$. In step 305, the master control re-calibrates the digital-to-analog conversion using the procedure described above with respect to FIG. 2. In step 306, the master control saves the values of the polynomial coefficients $a'_i$ in a storage array $LAST'_i$. Then, in step 307, the master control again calibrates the analog-to-digital conversion using the procedure described above with respect to FIG. 12A or FIG. 12B. In step 308, the master control increments the iteration counter N by 1.

To test for convergence, in step 309 the master control computes the difference $E_i$ between the last value and the current value of each of the polynomial coefficients $a_i$ for i=0, 2 and 3. In step 310, the magnitude of the difference $E_i$ is compared to a limit $LIM_i$ for i=0, 2, and 3, and if the magnitude of any difference exceeds its respective limit, then in step 311 the iteration counter N is compared to a maximum value NMAX. If the maximum value is not exceeded, then the procedure loops back to step 304 to perform another iteration. Otherwise, in step 312 a DAC convergence error is reported, for example, to a human operator of the system, or to a computer which is connected to the system. After step 312, the calibration routine is finished.

In step 310, if the magnitude of each difference $E_i$ is less than its respective limit for each of the polynomial coefficients, then in step 313 the difference $E'_i$ between the old value and the new value for each of the polynomial coefficients $a'_i$ is computed to test for convergence of the ADC calibration In step 314 if the magnitude of any difference $E'_i$ is greater than its respective limit $LIM'_i$, then in step 315 the iteration counter N is compared to the maximum NMAX. If the maximum is not exceeded, then the procedure loops back to step 304. Otherwise, in step 316, an ADC convergence error is reported to a human operator or to a computer to which the converter system is connected. After step 316, the calibration routine is finished. If in step 314 the magnitude of each difference $E'_i$ is not greater than its respective limit, then the calibration routine is also finished.

Figure 17:
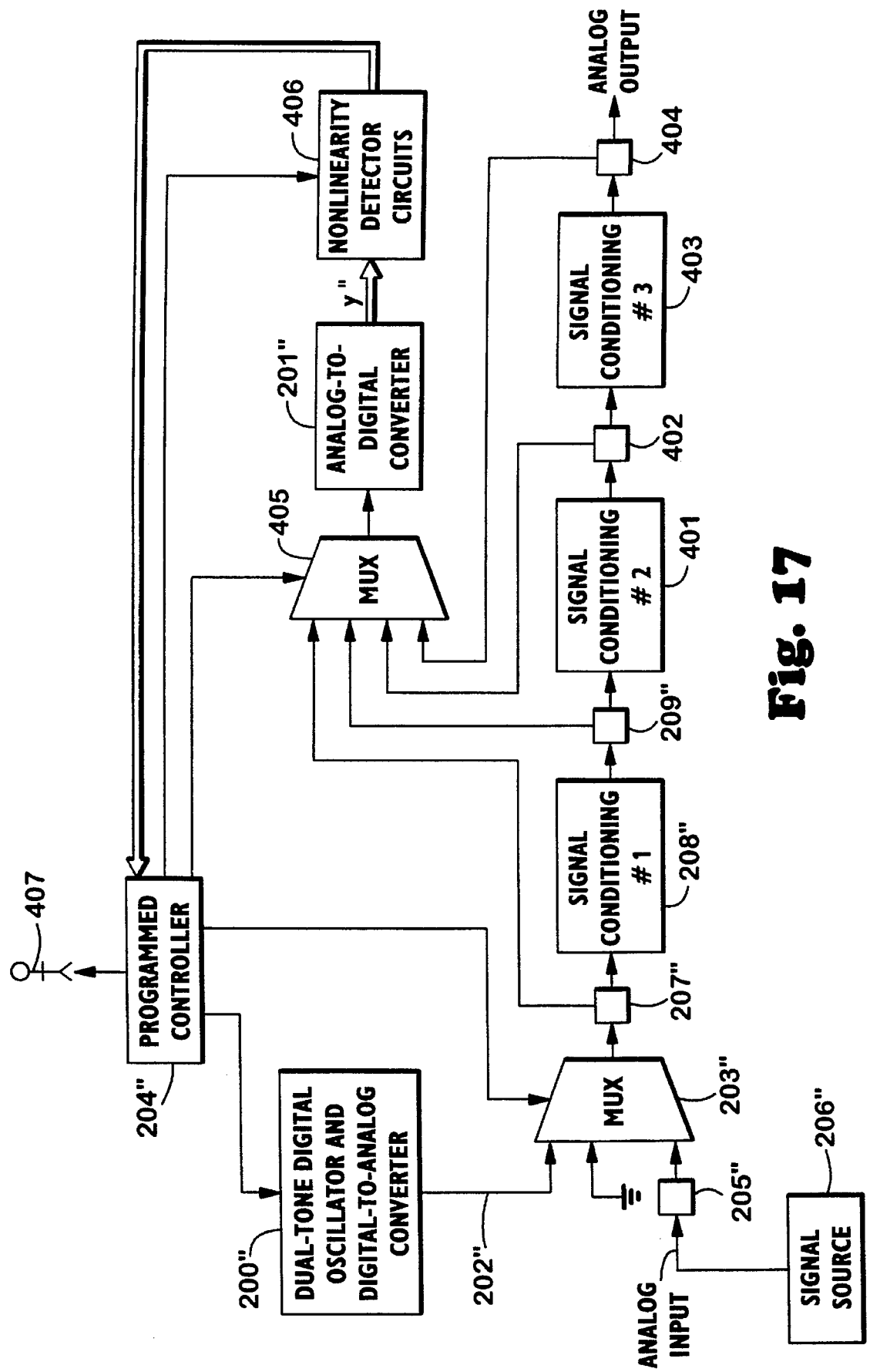
FIG. 17 is a block diagram showing a modification of the system of FIG. 12A or FIG. 12B for diagnosing a linearity problem in a particular one of a number of cascaded signal conditioning circuits.

Turning now to FIG. 17, there is shown a modification of the circuit of FIG. 12A or FIG. 12B for diagnosing a linearity problem in a particular one of a number of cascaded signal conditioning circuits. Components in FIG. 17 that are similar to components in FIG. 12A and FIG. 12B are designated with similar but double primed (")reference numerals. The signal conditioning circuits include a first signal conditioning circuit 208", a second signal conditioning circuit 401, and a third signal conditioning circuit 403.

The circuit in FIG. 17 includes an additional multiplexer 405 permitting an analog-to-digital converter 201" to convert an analog signal selected from either a terminal 207" that is the input to the first signal conditioning circuit 208", a terminal 209" that is the output of the first signal conditioning circuit 401, a terminal 402 that is the output of the second signal conditioning circuit 403, or a terminal 404 that is the output of the third signal conditioning circuit 403 and provides the analog output of the cascaded signal conditioning circuits.

The digital output y" of the analog-to-digital converter 201" is received by nonlinearity detector circuits 406. The nonlinearity detector circuits 406 are digital circuits for measuring the nonlinearity of a transfer function from a dual-tone digital oscillator and digital-to-analog converter 200" to the output y" of the analog-to-analog digital converter 201". In other words, the nonlinearity detector circuits 406 may include the components 210, 212, 213, 214, 215, 216, and 211 of FIG. 12A. Alternatively, the nonlinearity detector circuits 406 may include the components 210', 218, 213', 214', 216', and 211' of FIG. 12B. The polynomial coefficients determined by the nonlinearity detector circuits 406 are provided to a programmed controller 204" which also provides master control logic analogous to the master control logic 204 of FIG. 12A or the master control logic 204' of FIG. 12B.

Figure 18:
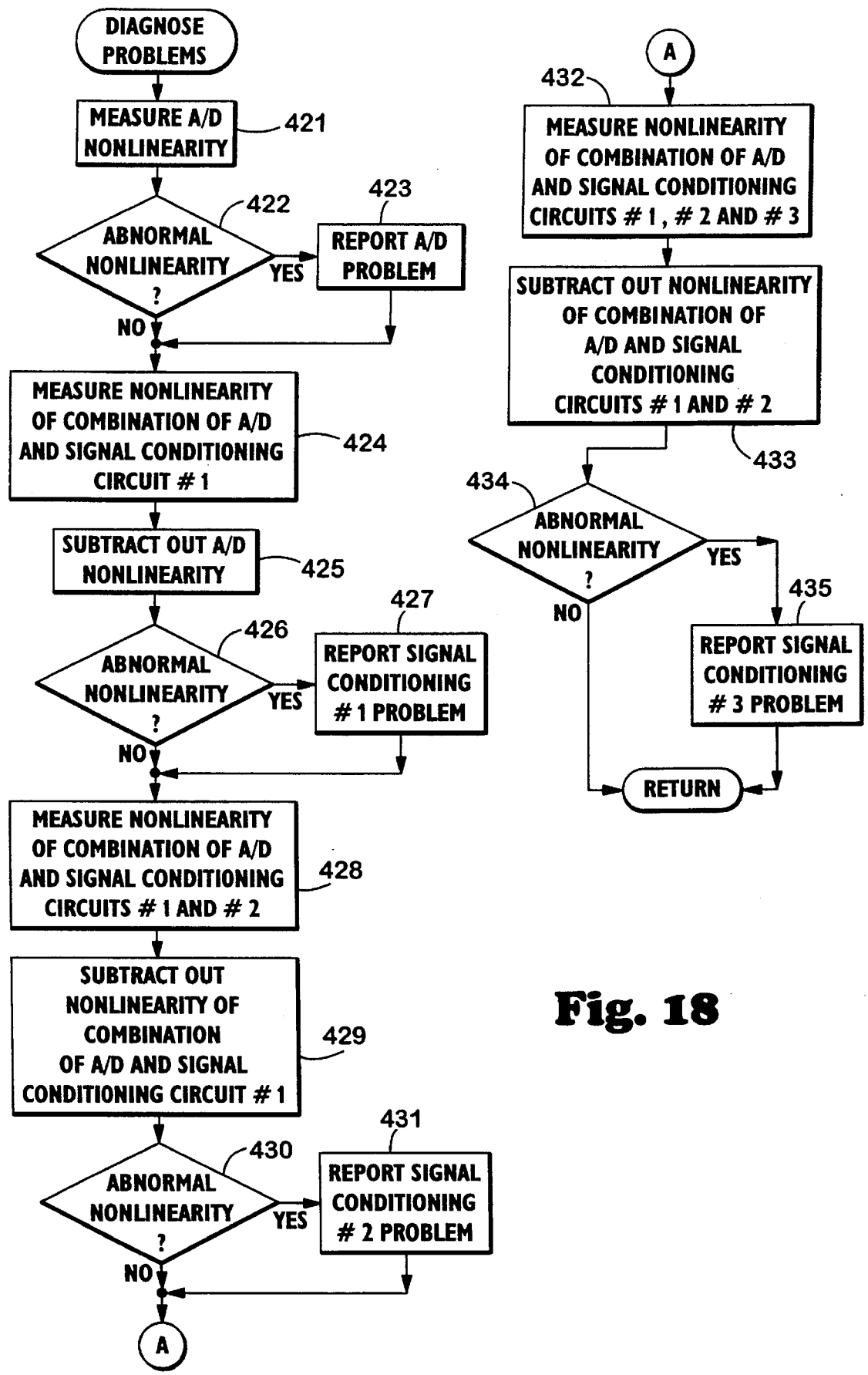
FIG. 18 is a flowchart of a procedure executed by a programmed controller for diagnosing a linearity problem in the circuit of FIG. 17.

Turning now to FIG. 18, there is shown a flowchart of a procedure executed by the programmed controller 204" for diagnosing a linearity problem in the circuit of FIG. 17. The flowchart in FIG. 18 represents a control program stored in memory of the programmed controller.

In the first step 421 of FIG. 18, the programmed controller 204" operates the circuitry in FIG. 17 to measure the nonlinearity of the analog-to-digital converter 201". In this case, the programmed controller 204" operates the dual-tone digital oscillator and digital-to-analog converter 200" to generate a dual-tone test signal 202". The programmed controller 204" enables the multiplexer 203" to select either the calibration signal 202" or ground for calibrating the analog-to-digital converter 201" by following the procedure described above with reference to FIG. 12A or FIG. 12B. This calibration procedure results in a determination of the nonlinearity of the analog-to-digital converter 201". In this case the programmed controller 204" also operates the multiplexer 405 so that the analog-to-digital converter 201" converts the analog signal selected by the multiplexer 203" and appearing on the terminal 207".

Next, in step 422, the programmed controller 204" checks the polynomial coefficients from the nonlinearity detector circuits 406 to determine whether the calibrated analog-to-digital converter 201" has abnormal linearity. If so, then execution branches to step 423 where an analog-to-digital converter problem is reported to a human operator 407 shown in FIG. 17. After step 423 in FIG. 18, or when step 422 does not find abnormal nonlinearity, then in step 424 the programmed controller operates the multiplexer 405 in FIG. 17 to select the analog signal from the output terminal 209" of the first signal conditioning circuit 208" The nonlinearity detector circuits 406 are operated to calibrate the combination of the first signal conditioning circuit 208" and the analog-to-digital converter 201", so that the resulting polynomial coefficients comprise a measurement of the nonlinearity of the combination of the analog-to-digital converter 201" and the first signal conditioning circuit 208".

Next, step 425 of FIG. 18, the programmed controller subtracts the analog-to-digital converter nonlinearity measured in step 421 from the nonlinearity of the combination of the analog-to-digital converter and the first signal conditioning circuit 208" measured in step 424. Therefore, the difference represents the nonlinearity of the first signal conditioning circuit 208". In step 425, for example, under the assumption that the nonlinearity is relatively small, the second-order coefficient measured in step 421 is subtracted from the second order coefficient measured in step 424 to determine a second-order coefficient representing the nonlinearity of the first signal conditioning circuit 208", and the third-order coefficient measured in step 421 is subtracted from the third-order coefficient measured in step 424 to determine a third-order coefficient representing the nonlinearity of the first signal conditioning circuit 208".

Next in step 426 the programmed controller determines whether the computed nonlinearity of the first signal conditioning circuit 208" is abnormal. For example, each of the second order and third-order coefficients for the first signal conditioning circuit 208" is compared to a respective threshold value to determine whether the first signal conditioning circuit 208" has abnormal nonlinearity. If so, then in step 427 the programmed controller 204" reports to the operator 407 of FIG. 17 that the first signal conditioning circuit 208" has a linearity problem.

After step 427, or when step 426 fails to find abnormal nonlinearity, execution continues in step 428. In step 428, the programmed controller 204" operates the multiplexer 405 to select the output of the second signal conditioning circuit 401 on the terminal 402. Then the programmed controller 204" operates the nonlinearity detector circuits 406 to calibrate the combination of the analog-to-digital converter 201", the first signal conditioning circuit 208", and the second signal conditioning circuit 401. When the calibration is completed, the polynomial coefficients are a measurement of the nonlinearity of the combination of the analog-to-digital converter 201" and the first and second signal conditioning circuits 208" and 401. Next, in step 429, the programmed controller 204" subtracts the measurement in step 424 from the measurement in step 428. This difference represents the nonlinearity of the second signal conditioning circuit 401.

In step 430 the programmed controller determines whether the nonlinearity of the second signal conditioning circuit 401 is abnormal. If so, then in step 431 the programmed controller 204" reports to the operator 407 that the second signal conditioning circuit has a linearity problem.

After step 430, or when step 431 fails to find abnormal nonlinearity, then in step 432 the programmed controller operates the multiplexer 405 to select the analog output from the third signal conditioning circuit 403 on the terminal 404. The programmed controller also operates the nonlinearity detector circuits 406 to calibrate the combination of the analog-to-digital converter 201", the first signal conditioning circuit 208", the second signal conditioning circuit 401, and the third signal conditioning circuit 403. After calibration, the polynomial coefficients from the nonlinearity detector circuits 406 are a measurement of the nonlinearity of the combination of the analog-to-digital converter 201" with the first, second, and third signal conditioning circuits. Next, in step 433 of FIG. 18, the programmed controller subtracts the measurement of step 428 from the measurement in step 431. This difference represents the nonlinearity of the third signal conditioning circuit 403.

In step 434, the programmed controller determines whether the nonlinearity of the third signal conditioning circuit 403 is abnormal. If so, then in step 435, the programmed controller 204" reports to the operator that the third signal conditioning circuit 403 has a linearity problem. After step 435, or when step 434 fails to find abnormal nonlinearity, the procedure in FIG. 18 is finished.

In cases where the signal conditioning circuits are linear absent a linearity problem, then the procedure of FIG. 18 can be simplified by terminating the procedure immediately after any of steps 423, 427, or 431 are reached. Therefore, if any of steps 425, 429, or 433 are reached, the nonlinearity that would be subtracted out is virtually zero, so that the subtraction operations of steps 425, 429, and 433 can be eliminated.

In view of the above, there has been described a method of diagnosing problems in an electrical circuit by monitoring changes in nonlinear characteristics. Abnormal nonlinearity is a sensitive indication of incipient component or system failure. By computing changes in nonlinearity coefficients over an interval of time, abnormal changes are distinguished from changes that are expected due to drift of operating conditions and aging of components. Nonlinearity in the linearity measuring circuit can be distinguished from nonlinearity of a particular signal processing circuit. Moreover, by measuring nonlinearity of a transfer characteristic from a signal input to successive signal outputs of cascaded signal conditioning circuits, a particular signal conditioning circuit can be identified and diagnosed as having a linearity problem.

What is claimed is:

1. A method of sensing and indicating an abnormal condition in an electrical circuit, said method comprising the steps of:

a) measuring nonlinearity of a transfer characteristic of the electrical circuit to determine a limit value for the nonlinearity of the transfer characteristic of the electrical circuit, and at a later time, again measuring the nonlinearity of the transfer characteristic to determine a coefficient indicating the nonlinearity of the transfer characteristic;

b) comparing said coefficient to said limit value to determine whether the nonlinearity of the transfer characteristic has become abnormal; and c) indicating a presence of said abnormal condition when said comparing of said coefficient to said limit value determines that the nonlinearity of the transfer characteristic has become abnormal.

2. The method as claimed in claim 1, wherein said step of indicating includes reporting said abnormal condition to a human operator.

3. The method as claimed in claim 1, wherein said step of indicating includes reporting said abnormal condition to a digital computer that is included in an electrical system that also includes said electrical circuit.

4. The method as claimed in claim 1, which further includes the step of repairing said electrical circuit in response to the presence of said abnormal condition being indicated in said step (c).

5. A method of sensing and indicating an abnormal condition in an electrical circuit, said method comprising the steps of:

a) measuring nonlinearity of said electrical circuit to obtain a first measurement of the nonlinearity of said electrical circuit, and at a later time, again measuring said nonlinearity of said electrical circuit to obtain a second measurement of said nonlinearity of said electrical circuit; and b) comparing said second measurement to said first measurement to detect an abnormal change in said nonlinearity; and c) indicating a presence of said abnormal condition when said comparing detects said abnormal change in said nonlinearity.

6. The method as claimed in claim 5, wherein said step of measuring includes exciting said electrical circuit with a signal having a frequency component, and measuring distortion generated from said frequency component by nonlinearity in said electrical circuit.

7. The method as claimed in claim 5, wherein said step b) of comparing includes computing a difference between said second measurement and said first measurement, and comparing said difference to a limit value to detect said abnormal change in nonlinearity.

8. The method as claimed in claim 5, wherein said step of indicating includes reporting said abnormal condition to a human operator.

9. The method as claimed in claim 5, wherein said step of indicating includes reporting said abnormal condition to a digital computer that is included in an electrical system that also includes said electrical circuit.

10. A method of sensing and indicating an abnormal condition in an electrical circuit, said method comprising the steps of:

a) measuring nonlinearity of said electrical circuit to obtain a first measurement of the nonlinearity of said electrical circuit, and at a later time, again measuring said nonlinearity of said electrical circuit to obtain a second measurement of said nonlinearity of said electrical circuit; and b) comparing said second measurement to said first measurement to detect an abnormal change in said nonlinearity; and c) indicating a presence of said abnormal condition when said comparing detects said abnormal change in said nonlinearity, wherein said first and second measurements are each obtained by determining a coefficient indicating nonlinearity of a transfer characteristic of said electrical circuit, and said method further includes using said coefficient for compensating said nonlinearity of said transfer characteristic.

11. An electronic system comprising, in combination:

a) a signal processing circuit;

b) digital circuitry connected to said signal processing circuit for measuring nonlinearity in a transfer characteristic of said signal processing circuit; and c) a programmed controller connected to said digital circuitry for controlling said digital circuitry and receiving from said digital circuitry a coefficient indicating nonlinearity of the transfer characteristic of said signal processing circuit; said programmed controller being programmed for comparing said coefficient to a limit value to determine whether said nonlinearity is abnormal, wherein said electronic system includes a digital oscillator connected to said signal processing circuit for exciting said signal processing circuit with a signal having a frequency component, and said digital circuitry includes a detector for detecting distortion generated from said frequency component by said nonlinearity of said transfer characteristic of said signal processing circuit.

12. The electronic system as claimed in claim 11, which includes a digital compensation circuit connected to said digital circuitry for receiving said coefficient indicating nonlinearity of the transfer characteristic of said signal processing circuit, said digital compensation circuit being connected to said signal processing circuit for compensating said nonlinearity of said transfer characteristic of said signal processing circuit.

13. An electronic system comprising, in combination:

a) a signal processing circuit;

b) digital circuitry connected to said signal processing circuit for measuring nonlinearity of a transfer characteristic of said signal processing circuit; and c) a programmed controller connected to said digital circuitry for controlling said digital circuitry and receiving from said digital circuitry measurements of said nonlinearity of said transfer characteristic of said signal processing circuit; said programmed controller being programmed for obtaining from said digital circuitry a first measurement of said nonlinearity of said transfer characteristic of said signal processing circuit, and at a later time, obtaining from said digital circuitry a second measurement of said nonlinearity of said transfer characteristic of said signal processing circuit, and comparing said second measurement to said first measurement to detect an abnormal change in said nonlinearity of said transfer characteristic of said electrical circuit.

14. The electronic system as claimed in claim 13, wherein said programmed controller is programmed for computing a difference between said second measurement and said first measurement, and comparing said difference to a limit value to detect said abnormal change in said nonlinearity of said transfer characteristic of said signal processing circuit.

15. The electronic system as claimed in claim 13, which includes a digital oscillator connected to said signal processing circuit for exciting said signal processing circuit with a signal having a frequency component, and said digital circuitry includes a detector for detecting distortion generated from said frequency component by nonlinearity in said transfer characteristic of said signal processing circuit in order to measure said nonlinearity of said transfer characteristic of said signal processing circuit.

16. The electronic system as claimed in claim 15, which includes a digital compensation circuit connected to said digital circuitry for receiving said first measurement and said second measurement of said nonlinearity of said transfer characteristic of said signal processing circuit, said digital compensation circuit being connected to said signal processing circuit for compensating said nonlinearity of said transfer characteristic of said signal processing circuit.

17. A method of sensing and indicating an abnormal condition in an electrical system including a plurality of signal processing circuits, said method comprising the steps of:

a) measuring nonlinearity of a first one of said signal processing circuits to obtain a first measurement of nonlinearity, and measuring nonlinearity of a combination of said first one of said signal processing circuits and a second one of said signal processing circuits to obtain a second measurement of nonlinearity;

b) computing nonlinearity of said second one of said signal processing circuits from said first measurement of nonlinearity and said second measurement of nonlinearity; and c) indicating that said second one of said signal processing circuits has an abnormal condition when said nonlinearity computed in step b) is abnormal, wherein said first one of said signal processing circuits and said second one of said signal processing circuits are connected in series, and said step a) of measuring includes passing a first signal through said first one of said signal processing circuits to obtain said first measurement of nonlinearity, and passing a second signal through both of said first one of said signal processing circuits and said second one of said signal processing circuits to obtain said second measurement of nonlinearity.

18. The method as claimed in claim 17, wherein said first signal has a first frequency component, and step a) includes measuring distortion generated from said first frequency component by said nonlinearity of said first one of said signal processing circuits to obtain said first measurement of nonlinearity; and said second signal has a second frequency component, and said step a) includes measuring distortion generated from said second frequency component by said nonlinearity of said combination of said first one of said signal processing circuits and said second one of said signal processing circuits to obtain said second measurement of nonlinearity.

19. The method as claimed in claim 18, wherein said step b) of computing includes computing a difference between said second measurement and said first measurement.

20. The method as claimed in claim 18, wherein said first one of said signal processing circuits is an analog-to-digital converter, said step a) includes calibrating said analog-to-digital converter to obtain said first measurement of nonlinearity, and said step a) includes passing said second signal through said second one of said signal processing circuits and from said second one of said signal processing circuits to said analog-to-digital converter to obtain said second measurement of nonlinearity.

21. The method as claimed in claim 18, wherein said step a) further includes converting said first signal from analog form to digital form and digitally processing said digital form of said first signal to measure said distortion generated from said first frequency component by said nonlinearity of said first one of said signal processing circuits to obtain said first measurement of nonlinearity, and wherein said step a) further includes converting said second signal from analog form to digital form and digitally processing said digital form of said second signal to measure said distortion generated from said second frequency component by said nonlinearity of said combination of said first one of said signal processing circuits and said second one of said signal processing circuits to obtain said second measurement of nonlinearity.

22. An electronic system comprising, in combination:

a) an analog signal generator for generating an analog signal;

b) a signal processing circuit having a signal input connected to said analog signal generator for receiving said analog signal and a signal output;

c) an analog multiplexer connected to said analog signal generator and to said signal output of said signal processing circuit for selecting said analog signal either before or after processing by said signal processing circuit;

d) an analog-to-digital converter connected to said analog multiplexer for digitizing the signal selected by said analog multiplexer and asserting the digitized signal on a digital output;

e) digital circuitry connected to said digital output of said analog-to-digital converter for analyzing said digitized signal to produce measurements of nonlinearity of a transfer characteristic from said analog signal generator to said digital output; and f) a programmed controller connected to digital circuitry for receiving said measurements of said nonlinearity of said transfer characteristic from said digital circuitry and connected to said multiplexer for operating said multiplexer so that one of said measurements indicates nonlinearity of said analog-to-digital converter and another of said measurements indicates nonlinearity of a combination of said signal processing circuit and said analog-to-digital converter, said programmed controller being programmed to compute an indication of nonlinearity of said signal processing circuit from said one of said measurements and said another of said measurements.

23. The electronic system as claimed in claim 22, wherein said signal processing circuit includes a plurality of cascaded signal conditioning circuits, said analog multiplexer has a respective analog input connected to a signal output of each of the cascaded signal conditioning circuits for receiving said analog signal after conditioning by a respective one of said signal conditioning circuits, and wherein said programmed controller is programmed to compute an indication of nonlinearity of each of said signal conditioning circuits from said measurements received from said digital circuitry.

24. The electronic system as claimed in claim 23, wherein said programmed controller is further programmed to indicate that a respective one of said signal conditioning circuits has a linearity problem when said indication of nonlinearity of said respective one of said signal conditioning circuits is abnormal.

25. An electronic system comprising, in combination:

a) an analog signal generator for generating an analog signal;

b) a signal processing circuit having a signal input connected to said analog signal generator for receiving said analog signal, said signal processing circuit including a plurality of cascaded signal conditioning circuits, each of said signal conditioning circuits having a respective signal output;

c) an analog multiplexer having a respective analog input connected to each signal output for selecting said analog signal after conditioning by a respective one of said signal conditioning circuits;

d) an analog-to-digital converter connected to said analog multiplexer for digitizing the analog signal selected by said analog multiplexer and asserting the digitized signal on a digital output;

e) digital circuitry connected to said digital output of said analog-to-digital converter for analyzing said digitized signal to produce measurements of nonlinearity of a transfer characteristic from said analog signal generator to said digital output; and f) a programmed controller connected to digital circuitry for receiving said measurements of said nonlinearity of said transfer characteristic from said digital circuitry and connected to said multiplexer for operating said multiplexer, said programmed controller being programmed to operate said multiplexer to select a respective analog signal from each signal output and to receive from said digital circuitry a measurement representing nonlinearity of a respective transfer function from each signal output, and for computing from said measurements a respective indication of nonlinearity of each of said signal conditioning circuits.

26. The electronic system as claimed in claim 25, wherein said programmed controller is further programmed to indicate that a respective one of said signal conditioning circuits has a linearity problem when said indication of nonlinearity of said respective one of said signal conditioning circuits is abnormal.

* * * * *